United States Patent
Guo et al.

(10) Patent No.: US 11,496,117 B1
(45) Date of Patent: Nov. 8, 2022

(54) STABLE CUCKOO FILTER FOR DATA STREAMS

(71) Applicant: Deke Guo, Hunan (CN)

(72) Inventors: Deke Guo, Hunan (CN); Lailong Luo, Hunan (CN); Shangsen Li, Hunan (CN); Yi Wang, Hunan (CN); Long Zheng, Hunan (CN); Yahui Wu, Hunan (CN)

(73) Assignee: NATIONAL UNIVERSITY OF DEFENSE TECHNOLOGY, Changsha (CN)

( * ) Notice: Subject to any disclaimer, the term of this patent is extended or adjusted under 35 U.S.C. 154(b) by 0 days.

(21) Appl. No.: 17/412,176

(22) Filed: Aug. 25, 2021

(51) Int. Cl.
*H03H 17/02* (2006.01)
*G06F 16/22* (2019.01)

(52) U.S. Cl.
CPC ......... *H03H 17/02* (2013.01); *G06F 16/2255* (2019.01)

(58) Field of Classification Search
None
See application file for complete search history.

(56) References Cited

U.S. PATENT DOCUMENTS

| | | | | |
|---|---|---|---|---|
| 2010/0011028 A1* | 1/2010 | Dade | .................... | G06F 16/2255 707/E17.037 |
| 2014/0310476 A1* | 10/2014 | Kruus | ................. | G06F 12/0871 711/133 |
| 2015/0052309 A1* | 2/2015 | Philip | .................... | G06F 12/082 711/128 |
| 2017/0068669 A1* | 3/2017 | Levy | .................... | H04L 45/7453 |
| 2017/0235496 A1* | 8/2017 | Brosch | .................. | G06F 3/0685 707/692 |
| 2019/0266252 A1* | 8/2019 | Breslow | .............. | G06F 16/2255 |
| 2021/0034674 A1* | 2/2021 | Palsetia | ............... | G06F 16/9017 |
| 2021/0271710 A1* | 9/2021 | Schlegel | ............. | G06F 16/9024 |

OTHER PUBLICATIONS

Khalid, "Optimized Cuckoo Filters for Efficient Distributed SDN and NFV Applications", 2020 (Year: 2020).*

* cited by examiner

*Primary Examiner* — Aleksandr Kerzhner
*Assistant Examiner* — Anugeetha Kunjithapatham
(74) *Attorney, Agent, or Firm* — Dragon Sun Law Firm, PC; Jinggao Li; Nathaniel Perkins

(57) ABSTRACT

A method for updating a stable cuckoo filter used for membership testing of data streams, executed by a processor, is described. The method includes the steps of: performing a first hash on a first element to be inserted into the stable cuckoo filter to determine a first candidate bucket; performing a second hash on a fingerprint of the first element to determine a second candidate bucket; selecting a target candidate bucket from a group consisting of the first candidate bucket and the second candidate bucket; inserting the first element into the target candidate bucket; updating the stable cuckoo filter according to one or more of a random update strategy, an insertion failure update strategy, a scanning strategy, a skip scanning update strategy, a blocked design strategy and a local time-sensitive update strategy; and obtaining an updated stable cuckoo filter.

2 Claims, 34 Drawing Sheets

| | kick-out strategy | Scan pointer | Update overhead | Query overhead | Space ($\infty$) | Probability of TTL |
|---|---|---|---|---|---|---|
| Random | optional | × | $O(1)$ | $O(1)$ | $\frac{b-1}{b}$ | $\left(\frac{mb-1}{mb}\right)^{t-1} \frac{1}{mb}$ |
| Insertion failure | optional | × | $O(1)$ | $O(1)$ | Full | $\left(\frac{m-1}{m}\right)^{2(t-1)} \frac{2m-1}{m^2}$ |
| Scanning | mandatory | ✓ | $O(1)$ | $O(1)$ | $\leq \frac{b-1}{b}$ | $\frac{mb(b-2)}{b}, mb$ |
| Skip scanning | mandatory | ✓ | $O(1)$ | $O(1)$ | $\frac{b-1}{b}$ | $\frac{mb(b-2)}{b}, mb$ |
| Block design | optional | — | $O(1)$ | $O(N)$ | $\frac{b-1}{b}$ | $\frac{mb(N-2)}{N}, mb$ |
| Flag bits | mandatory | ✓ | $O(1)$ | $O(1)$ | $\leq 2f(2+4f)$ | $C_q^a \left(\frac{1}{2}\right)^q C_{t-1}^{q-1} 2(t-q)$ |
| Empty slots | mandatory | × | $O(1)$ | $O(1)$ | $\frac{b-1}{b}$ | $C_q^a \left(\frac{1}{2}\right)^q C_{t-1}^{q-1} 2(t-q) \left(\frac{2m-1}{m^2}\right)^q$ |
| FIFO | mandatory | × | $O(1)$ | $O(1)$ | Full | $C_q^a \left(\frac{1}{2}\right)^q C_{t-1}^{q-1} \left(\frac{m-1}{m}\right)^{2(t-q)} \left(\frac{2m-1}{m^2}\right)^q$ |

FIG. 7

| | Space occupancy | Exact time-sensitive update | Less update overhead |
|---|---|---|---|
| Random update | x | | ✓ |
| Insertion failure update | ✓ | | ✓ |
| Scanning update | x | x | ✓ |
| Skip scanning update | x | x | ✓ |
| Block design | x | ✓ | x |
| Local time-sensitive update — Flag bits | ✓ | ✓ | x |
| Local time-sensitive update — Empty slots | x | ✓ | ✓ |
| Local time-sensitive update — FIFO | ✓ | ✓ | ✓ |

FIG. 8

STABLE CUCKOO FILTER FOR DATA STREAMS

CROSS-REFERENCE TO RELATED PATENT APPLICATIONS

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference is individually incorporated by reference. In terms of notation, hereinafter, [n] represents the nth reference cited in the reference list. For example, [1] represents the first reference cited in the reference list, namely, GMSA, "GSMA intelligence," https://www.gsmaintelligence.com/, Accessed On: February 2019.

TECHNICAL FIELD

The present disclosure relates to the field of set membership queries for data streams, and more particularly relates to a system and method for updating a stable cuckoo filter (SCF) for performing membership testing for data streams.

BACKGROUND

Cuckoo filters (CF), Bloom filters (BF) and variants thereof are space-efficient probabilistic data structures that may be utilized for approximate set membership queries. However, the data synopsis if CG and BF inevitably become unusable when there are a number of member updates on the set. Additionally, updates may be common in real-world data streaming applications such as, without limitation, duplicate item detection, malicious URL checking, and caching applications. It has been shown that some variants of BF can be adaptive to stream applications. However, current extensions of BF structures generally incur unstable performance or intolerant membership testing errors. A data synopsis for membership testing on data streams with stable performance and tolerant query errors is described herein.

Therefore, a heretofore unaddressed need exists in the art to address the aforementioned deficiencies and inadequacies.

SUMMARY

In one embodiment, a method for updating a stable cuckoo filter used for membership testing of data streams, executed by a processor, is described. The method includes the steps of: performing a first hash on a first element to be inserted into the stable cuckoo filter to determine a first candidate bucket; performing a second hash on a fingerprint of the first element to determine a second candidate bucket; selecting a target candidate bucket from a group consisting of the first candidate bucket and the second candidate bucket; inserting the first element into the target candidate bucket; updating the stable cuckoo filter according to one or more of a random update strategy, an insertion failure update strategy, a scanning strategy, a skip scanning update strategy, a blocked design strategy and a local time-sensitive update strategy; and obtaining an updated stable cuckoo filter achieving at least one of a space occupancy rationale, a time-sensitive update rationale, and a less update overhead rationale, wherein the stable cuckoo filter comprises one or more buckets and the one or more buckets comprise one or more slots, and wherein the local time-sensitive update strategy includes: encoding time information into the one or more buckets; and evicting an oldest element from the target candidate bucket according to the time information; wherein one or more of a first in first out (FIFO) update strategy, a flag bits update strategy, and an empty slots update strategy, is used for the encoding.

In another embodiment, the FIFO update strategy includes: maintaining slots of the candidate bucket as a FIFO queue based on insertion order; updating each of the slot of the candidate bucket with a next latest inserted element; and updating an insertion slot of the candidate bucket with the fingerprint of the first element, wherein the insertion slot is configured to store a fingerprint of a latest inserted element.

In another embodiment, the flag bits update strategy includes: maintaining one or more flag bits to record an index of a last updated slot of the target candidate bucket; updating a target slot with the fingerprint of the first element; and updating the one or more flag bits with an index of the target slot.

In another embodiment, the empty slots update strategy includes: maintaining an empty slot in the target candidate bucket; inserting the fingerprint of the first element into the empty slot; and deleting a next slot to create a new empty slot.

In another embodiment, the skip scanning update strategy includes: determining that a space occupancy of the stable cuckoo filter reached a first threshold; performing a slot checking of a next slot according to a bucket traversal strategy; determining that the next slot contains a stored element and deleting the stored element; and inserting the fingerprint of the first element into the next slot, wherein a step-b scanning pointer references a working slot and the slot checking determines if the working slot and the next slot are vacant.

In another embodiment, the skip scanning update strategy further includes: maintaining the candidate bucket such that a last emptied slot of the candidate bucket is a first slot allocated to store the fingerprint of the first element.

In another embodiment, the scanning strategy includes: determining that a space occupancy of the stable cuckoo filter reached a second threshold; performing a slot checking of a next slot according to a slot traversal strategy; determining that the next slot contains a stored element and deleting the stored element; and inserting the fingerprint of the first element into the next slot, wherein a scanning pointer references a working slot and the slot checking determines if the working slot and the next slot are vacant.

In another embodiment, the insertion failure update strategy includes: determining that the first element cannot be successfully inserted into the target candidate bucket; randomly deleting an element stored in the target candidate bucket to create an empty slot; and inserting the first element into the empty slot.

In another embodiment, the random update strategy includes: randomly deleting elements stored in the stable cuckoo filter to free space for newly inserted elements. In another embodiment, the blocked design strategy includes: inserting new elements into a freshest sub cuckoo filter until the freshest sub cuckoo filter is in a full state, clearing a stalest sub cuckoo filter, setting the stalest sub cuckoo filter as the freshest sub cuckoo filter; and setting a next oldest sub cuckoo filter as the stalest sub cuckoo filter, wherein the stable cuckoo filter comprises two or more sub cuckoo filters, the two or more sub cuckoo filters comprising at least the freshest sub cuckoo filter and the stalest sub cuckoo filter.

In another embodiment, the inserting new elements further includes updating the freshest sub cuckoo filter using one or more of the random update strategy, the scanning strategy, and the skip scanning update strategy.

In another embodiment, a non-transitory computer readable medium containing program instructions for updating a stable cuckoo filter used for membership testing of data streams is described, wherein execution of the program instructions by one or more processors of a computer system causes the one or more processors to carry out the steps of: performing a first hash on a first element to be inserted into the stable cuckoo filter to determine a first candidate bucket; performing a second hash on a fingerprint of the first element to determine a second candidate bucket; selecting a target candidate bucket from a group consisting of the first candidate bucket and the second candidate bucket; inserting the first element into the target candidate bucket; updating the stable cuckoo filter according to one or more of a random update strategy, an insertion failure update strategy, a scanning strategy, a skip scanning update strategy, a blocked design strategy and a local time-sensitive update strategy; and obtaining an updated stable cuckoo filter achieving at least one of a space occupancy rationale, a time-sensitive update rationale, and a less update overhead rationale, wherein the stable cuckoo filter comprises one or more buckets and the one or more buckets comprise one or more slots, and wherein the local time-sensitive update strategy comprises: encoding time information into the one or more buckets; and evicting an oldest element from the target candidate bucket according to the time information; wherein one or more of a first in first out (FIFO) update strategy, a flag bits update strategy, and an empty slots update strategy, is used for the encoding. In another embodiment, the FIFO update strategy includes maintaining slots of the candidate bucket as a FIFO queue based on insertion order; updating the slots of the candidate bucket with a next latest inserted element; and updating an insertion slot of the candidate bucket with the fingerprint of the first element, wherein the insertion slot is configured to store a fingerprint of a latest inserted element.

In another embodiment, the flag bits update strategy includes: maintaining one or more flag bits to record an index of a last updated slot of the target candidate bucket; updating a target slot with the fingerprint of the first element; and updating the one or more flag bits with an index of the target slot.

In another embodiment, the empty slots update strategy includes: maintaining an empty slot in the target candidate bucket; inserting the fingerprint of the first element into the empty slot; and deleting a next slot to create a new empty slot.

In another embodiment, the skip scanning update strategy includes: determining that a space occupancy of the stable cuckoo filter reached a first threshold; performing a slot checking of a next slot according to a bucket traversal strategy; determining that the next slot contains a stored element and deleting the stored element; and inserting the fingerprint of the first element into the next slot, wherein a step-b scanning pointer references a working slot and the slot checking determines if the working slot and the next slot are vacant.

In another embodiment, the skip scanning update strategy further includes: maintaining the candidate bucket such that a last emptied slot of the candidate bucket is a first slot allocated to store the fingerprint of the first element.

In another embodiment, the scanning strategy includes: determining that a space occupancy of the stable cuckoo filter reached a second threshold; performing a slot checking of a next slot according to a slot traversal strategy; determining that the next slot contains a stored element and deleting the stored element; and inserting the fingerprint of the first element into the next slot, wherein a scanning pointer references a working slot and the slot checking determines if the working slot and the next slot are vacant.

In another embodiment, the insertion failure update strategy includes: determining that the first element cannot be successfully inserted into the target candidate bucket; randomly deleting an element stored in the target candidate bucket to create an empty slot; and inserting the first element into the empty slot.

In another embodiment, the blocked design strategy includes: inserting new elements into a freshest sub cuckoo filter until the freshest sub cuckoo filter is in a full state, clearing a stalest sub cuckoo filter, setting the stalest sub cuckoo filter as the freshest sub cuckoo filter; and setting a next oldest sub cuckoo filter as the stalest sub cuckoo filter, wherein the stable cuckoo filter comprises two or more sub cuckoo filters, the two or more sub cuckoo filters comprising at least the freshest sub cuckoo filter and the stalest sub cuckoo filter.

BRIEF DESCRIPTION OF THE DRAWINGS

The accompanying drawings illustrate one or more embodiments of the present disclosure and, together with the written description, serve to explain the principles of the present disclosure, wherein:

FIGS. 1A-1B illustrate exemplary graphs for performance on streaming data, wherein FIG. 1A shows performance for BF variants and FIG. 1B shows performance of SCF vs CF, in accordance with an embodiment of the present disclosure;

FIGS. 3A-3B illustrate exemplary traversal strategies, wherein FIG. 3A shows a slot traversal strategy for a scanning update strategy and FIG. 3B shows a bucket traversal strategy for a skip scanning update strategy, in accordance with an embodiment of the present disclosure;

FIGS. 5A-5B illustrate exemplary graphs for performance of different update strategies, wherein FIG. 5A shows a space occupancy comparison and FIG. 5B shows a membership testing query comparison, in accordance with an embodiment of the present disclosure;

FIGS. 6A-6C illustrate an exemplary local time-sensitive update strategy, wherein FIG. 6A shows a flag bits update strategy, FIG. 6B shows an empty slots update strategy, and FIG. 6C shows a FIFO update strategy, in accordance with an embodiment of the present disclosure;

FIG. 7 illustrates an exemplary table showing an overhead comparison between different update strategies of a SCF, in accordance with an embodiment of the present disclosure;

FIG. 8 illustrates an exemplary table showing a comparison between different update strategies of a SCF, in accordance with an embodiment of the present disclosure;

FIGS. 9A-9D illustrate exemplary graphs for space occupancy, wherein FIG. 9A shows DocWords performance, FIG. 9B shows Higgs performance, FIG. 9C shows WIDE traffic trace performance, and FIG. 9D shows Synthetic dataset performance, in accordance with an embodiment of the present disclosure;

FIGS. 10A-10D illustrate exemplary graphs for insertion throughput, wherein FIG. 10A shows DocWords performance, FIG. 10B shows Higgs performance, FIG. 10C shows WIDE traffic trace performance, and FIG. 10D shows Synthetic dataset performance in accordance with an embodiment of the present disclosure;

FIGS. 11A-11D illustrate exemplary graphs for query accuracy, wherein FIG. 11A shows DocWords performance, FIG. 11B shows Higgs performance, FIG. 11C shows WIDE traffic trace performance, and FIG. 11D shows Synthetic dataset performance, in accordance with an embodiment of the present disclosure;

FIGS. 12A-12D illustrate exemplary graphs for false negative rate, wherein FIG. 12A shows DocWords performance, FIG. 12B shows Higgs performance, FIG. 12C shows WIDE traffic trace performance, and FIG. 12D shows Synthetic dataset performance, in accordance with an embodiment of the present disclosure;

FIGS. 13A-13D illustrate exemplary graphs for F1 score, wherein FIG. 13A shows DocWords performance, FIG. 13B shows Higgs performance, FIG. 13C shows WIDE traffic trace performance, and FIG. 13D shows Synthetic dataset performance, in accordance with an embodiment of the present disclosure.

DETAILED DESCRIPTION

Figure 1A:
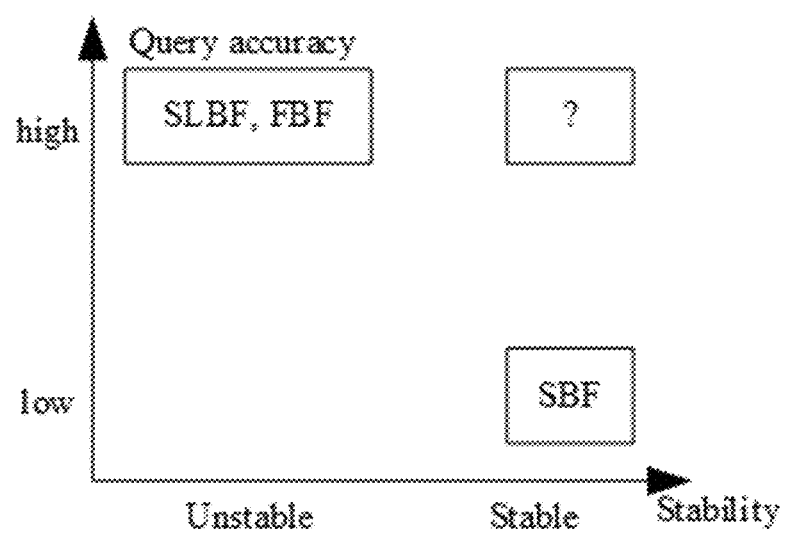

The present disclosure will now be described more fully hereinafter with reference to the accompanying drawings, in which exemplary embodiments of the present disclosure are shown. The present disclosure may, however, be embodied in many different forms and should not be construed as limited to the embodiments set forth herein. Rather, these embodiments are provided so that this disclosure is thorough and complete, and will fully convey the scope of the present disclosure to those skilled in the art. Like reference numerals refer to like elements throughout.

The terms used in this specification generally have their ordinary meanings in the art, within the context of the present disclosure, and in the specific context where each term is used. Certain terms that are used to describe the present disclosure are discussed below, or elsewhere in the specification, to provide additional guidance to the practitioner regarding the description of the present disclosure. For convenience, certain terms may be highlighted, for example using italics and/or quotation marks. The use of highlighting and/or capital letters has no influence on the scope and meaning of a term; the scope and meaning of a term are the same, in the same context, whether or not it is highlighted and/or in capital letters. It is appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only and in no way limits the scope and meaning of the present disclosure or of any exemplified term. Likewise, the present disclosure is not limited to various embodiments given in this specification.

It is understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It is understood that, although the terms Firstly, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below can be termed a second element, component, region, layer or section without departing from the teachings of the present disclosure.

It is understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is also appreciated by those of skill in the art that references to a structure or feature that is disposed "adjacent" to another feature may have portions that overlap or underlie the adjacent feature.

The terminology used herein is for the purpose of describing particular embodiments only and is not intended to be limiting of the present disclosure. As used herein, the singular forms "a," "an," and "the" are intended to include the multiple forms as well, unless the context clearly indicates otherwise. It is further understood that the terms "comprises" and/or "comprising," or "includes" and/or "including" or "has" and/or "having" when used in this specification specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It is understood that relative terms are intended to encompass different orientations of the device in addition to the orientation shown in the figures. For example, if the device in one of the figures is turned over, elements described as being on the "lower" side of other elements will then be oriented on the "upper" sides of the other elements. The exemplary term "lower" can, therefore, encompass both an orientation of lower and upper, depending on the particular orientation of the figure. Similarly, for the terms "horizontal", "oblique" or "vertical", in the absence of other clearly defined references, these terms are all relative to the ground. Similarly, if the device in one of the figures is turned over, elements described as "below" or "beneath" other elements will then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present disclosure belongs. It is further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around," "about," "substantially," "generally" or "approximately" shall generally mean within 20 percent, preferably within 10 percent, and more preferably within 5 percent of a given value or range. Numerical quantities given herein are approximate, meaning that the terms "around," "about," "substantially," "generally" or "approximately" can be inferred if not expressly stated.

As used herein, the terms "comprise" or "comprising," "include" or "including," "carry" or "carrying," "has/have" or "having," "contain" or "containing," "involve" or "involving" and the like are to be understood to be open-ended, i.e., to mean including but not limited to.

As used herein, the phrase "at least one of A, B, and C" should be construed to mean a logical (A or B or C), using a non-exclusive logical OR. It should be understood that one or more steps within a method may be executed in different order (or concurrently) without altering the principles of the present disclosure.

Embodiments of the present disclosure are illustrated in detail hereinafter with reference to accompanying drawings. It should be understood that specific embodiments described herein are merely intended to explain the present disclosure, but not intended to limit the present disclosure.

In order to further elaborate the technical means adopted by the present disclosure and its effect, the technical scheme of the present disclosure is further illustrated in connection with the drawings and through specific mode of execution, but the present disclosure is not limited to the scope of the implementation examples.

The present disclosure relates to the field of set membership queries for data streams, and more particularly relates to a system and method for performing membership testing for data streams using a stable cuckoo filter (SCF).

To accomplish membership testing on data streams with stable performance and tolerant query errors, Stable Cuckoo Filters (SCF) are proposed, which utilize a fine-grained process for evicting stale elements and storing more recent elements. SCF absorbs design philosophy from several unsuccessful designs. Specifically, SCFs use update operations to embed time information with insertion operations while carefully evicting stale elements. A tight upper bound of the expected false positive rate (FPR) remains asymptotically constant over the insertion of new members and the false negative rate (FNR) for recent elements of SCF is related to characteristics of the input data stream and query workloads. Extensive experiments on real-world and synthetic datasets show that SCF is more stable than existing variants of BF and realize 7× smaller false errors and up to 3× better throughput.

CF [1] and BF [2] are simple, space-efficient probabilistic data structures designed for membership queries. Membership queries are used to test whether or not a queried element x is in a given set S. Due to their wide applications, many optimizations and variants have been proposed [2] [3] [4] [5] [6] [7] [8] [9] [10], especially in database and networking. Although CFs may have been explored and evaluated in both academia and industry, conventional CFs are not well equipped to perform membership testing for data streams. In many streaming data applications, allocated space is relatively small compared to the size of a continuous and endless stream. With more and more elements arriving, the available space for new elements will decrease continuously. Additionally, the probability of insertion failure will increase accordingly. In a "full" state, the new elements cannot be inserted into the CF, thus rendering the CF unusable. In many applications, however, only the most recent information of the stream is essential [11] [12] [13]. Three typical use cases are listed below:

Use Case 1: In cache systems [14] [15] [16] [17], cache memory maintains the most recently accessed objects so that the objects can be accessed immediately without accessing the main memory. As the cache objects are updated, the data synopsis organized by BFs or CFs of the cache system must be updated periodically by new objects. The coarse-grained strategy of conventional BFs and CFs typically cannot make continuous updates in time. To update changes in time, a time-sensitive update strategy for membership synopsis is needed.

Use Case 2: In network measurement, a monitor points need to test whether a packet belongs to a new flow to support flow-level measurement, such as identifying the total number of flows [18], differentiating large-small flows [19], and recording index information [20] [21]. A prefilter typically performs membership testing to check the existence of flows. However, these proposals are disposable (i.e. the data synopsis is usable for only one measurement epoch). When continuously performing measurement tasks on traffic streams, the aforementioned approaches may not be optimal.

Use Case 3: In network security, blacklists and whitelists are typically utilized in an Access Control Management System. Because hosts may become normal and legitimate hosts may subsequently be controlled by attackers, blacklists and whitelists may be updated periodically [22]. Devising a stable membership testing synopsis for an access control list may be required in such environments.

Figure 1B:
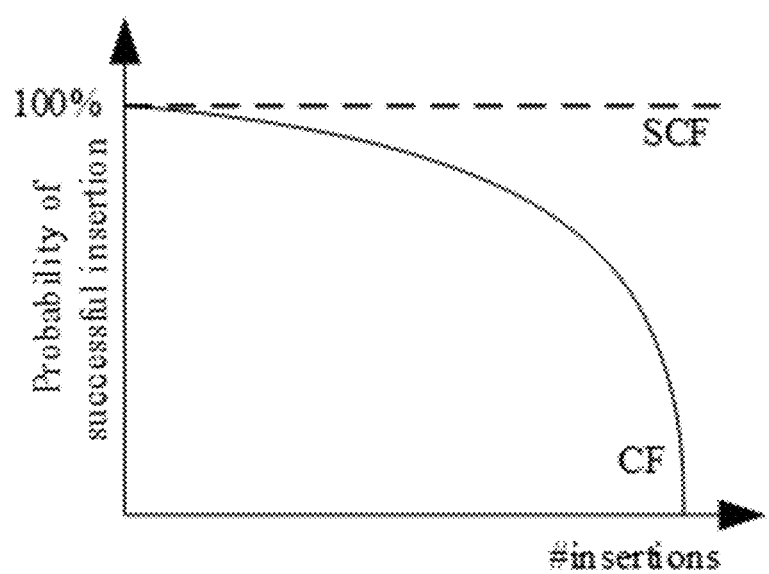

In many real-world stream applications, recent data is more important than older data [11] [13]. As illustrated in FIG. 1A, several approaches have enhanced BF for dynamic sets and streaming data applications. However, SBF incurs high query errors and a low insertion throughput. FBF [23] evicts stale elements with a coarse-grained method, which leads to unstable performance SLBF [13] incurs unstable performance and intolerant FPR due to the noise of stale elements and the absence of time information. Par-BF [24] was designed for fast query in large dynamic sets but is aimed at multi-process/core environments. DBA [25] dynamically creates groups of space-efficient BFs to accommodate changes in set sizes for dynamic sets. In conclusion, existing variants of BF incur unstable performance or intolerant query errors. CFs naturally supports deletion operations and can store multiple elements in a bucket. However, as illustrated in FIG. 1B, for conventional CFs, recent elements cannot be distinguished from old elements as no time information is stored. The new elements must be successfully inserted with a high probability of success. By careful design of insertion and eviction operation, CF can obtain stable performance and tolerable mismatches. To handle the dynamic insertion of new elements, CF update strategies may be utilized in designing a Stable Cuckoo filter (SCF). As illustrated in FIG. 1A, compared with the variants of BF, SCF offers less membership query error and stable performance. The following design rationales may be a focus of the current SCF design:

1) Space occupancy. As reported in CF [1], with proper setting of cuckoo hash table parameters, space occupancy can be 95% with high probability. With SCF, a higher space occupancy may be achieved while making CF stable for data streams.

2) Time-sensitive updates. To update the elements and maintain a stable CF (i.e., evicting the oldest elements from the filter and inserting the newest ones into the filter), SCF needs to evict elements according to their insertion time. However, it may not be space-efficient to record precise time information for each element and evict them according to their arrival time.

3) Less update overhead. SCF aims to achieve stability with little overhead based on CF. Specifically, an update strategy with a small additional space overhead and operation overhead may be achieved through SCF.

Figure 2:
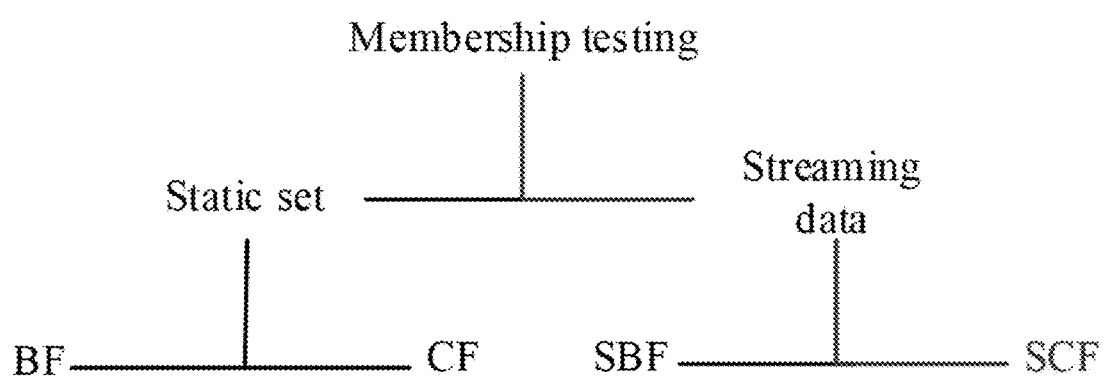
FIG. 2 illustrates an exemplary design space of SCF, in accordance with an embodiment of the present disclosure.

A "full" SCF may be avoided by evicting elements before the space occupancy reaches a predefined threshold. As such, SCF may be configured to continuously record the most-recent elements. Several different policies may be used to choose the element to evict. Specifically, six novel update strategies may be used to avoid capacity overflow and maintain recent elements in a data streaming environment. As illustrated in FIG. 2, contributions for the design, analysis, and evaluation of stable CFs is shown. The specific contributions are described as follows:

SCF, which extends and generalizes CF with six novel strategies, (i.e., random update, insertion failure update, scanning strategy, skip scanning update, blocked design and local time-sensitive update) to make CF stable and keep the most-recent data.

The present disclosure describes detailed analysis on the performance of proposed stable strategies and gives a well-rounded performance comparison among the proposed stable strategies.

The present disclosure further describes comprehensive experiments conducted on both real and synthetic data. The results show that the SCF can effectively keep stable performance with acceptable computation overhead for data streams.

Preliminaries

Structures and performance analysis of CF and BF are described. Aspects of CF and BF are used when constructing the SCF. Additionally, the SBF and other variants of BF are described, which are designed as membership testing data synopsis for unbounded data streams.

Standard Bloom Filter

Bloom filter (BF) [2] is an elegant data synopsis for membership testing. Since the advent of BF, it has found numerous applications. BF is composed of a bit array B containing m initialized-0 bits, randomly maps each element with k independent hash functions $h_1, \ldots, h_k$ to the range [1, m] and sets the corresponding bits $B[h_1], \ldots, B[h_k]$ to 1. To insert an element x from a finite set S with n elements, all k bits $B[h_1(x)], \ldots, B[h_k(x)]$ are set to 1. To test the membership of an element y, a positive answer will be returned when all k bits, $B[h_1(y)], \ldots, B[h_k(y)]$, are non-zero; otherwise, a negative result will be returned. Through such a design, BF can act as a membership-testing synopsis for an original set without a false negative error. After inserting all n elements from set S into BF, the false positive rate (FPR) for any non-member element y, i.e., $y \notin S$, can be formulated as:

$$PR_{BF} \approx Pr(B[h_i(y)]=1], \forall i \in 1, \ldots, k) \approx (1-e^{-kn/m})^k \quad (1)$$

When applying BF practically, n is the cardinality of the set, and m is the length of the bit array. The optimized $$k = \frac{m}{n}\ln 2$$

can ne calculated by setting the derivative of (1) to 0 and the corresponding FPR is $$0.5^{\frac{m}{n}\ln 2} \approx 0.6185^{\frac{m}{n}}.$$

BF is designed for membership testing for static sets, (i.e. the cardinality n of set S must be determined in advance). When the cardinality is unpredictable, for example in many data stream applications, BF with limited space may be disposable and cannot solve the membership testing task efficiently because of a disenabled deletion operation. Specifically, with more insertions, the fraction of 0-bit in BF will decrease continuously. Continuous insertions will lead to the FPR of the BF increasing accordingly, finally, reaching the limit, 1. At such a point, regardless of if an element y is a member or not, the BF will always returns a positive answer for membership testing.

Stable Bloom Filter

Stable Bloom filter (SBF) [12] is designed to approximately detect duplicates for streaming data with a limited space. The intrinsic idea of SBF is simple: it continuously evicts the stale elements to offer empty space for those more recent ones. Specifically, SBF replaces each initialized-0 bit, BF [1], ..., BF[m] in BF with initialized-0 d-bits counters SBF[1], ..., SBF[m] (i.e., SBF[i] ranges from 0 to MAX (MAX=$2^d$–1, $\forall i=1, \ldots, m$) for stability. To insert an element x, P counters are first randomly selected and decreased by 1 if they are non-zero; then similar to BF, k independent hash values, $h_1, \ldots, h_k$ are calculated, and k corresponding counters $SBF[h_1(x)], \ldots, SBF[h_k(x)]$ are set to MAX. To test the membership of an element y, the positive answer will be returned if all k counters $SBF[h_1(y)], \ldots, SBF[h_k(y)]$ are non-zero; otherwise, the non-member result will be returned. The highlight of SBF is that with a decrement decay strategy, the fraction of zero bit-counters in the counter array tends to be a constant when the number of inserted elements n→∞. The FPR of SBF maintains stable regardless of the number of inserted elements. However, the stability is achieved at the cost of a higher false negative rate (FNR). As reported in [12], the FNRSBF is related to the filter's parameters, as well as the distribution of queries.

Apart from SBF, many variants have been proposed. FBF [23] allows the older operations to automatically time out and be deleted by using multiple constituent BFs, which maintain a moving window of recent operations. DBF [26] dynamically maintains multiple sub-BFs to support concise representation and approximate membership queries of dynamic sets. SLBF [13] augments each cell in BF with multiple bits to represent the information of different periods. However, these variants either incur unstable performance or intolerant query errors.

Standard Cuckoo Filter

Cuckoo filter (CF) [1] is a compact hash table containing m buckets, each of which maintain b slots to store the f-bits fingerprint of elements. For each element x in a given set S, CF pre-computes a fingerprint $\eta_x$ and provides two candidate buckets $h_1(x)$, $h_2(x)$ to store the fingerprint, as illustrated in (2) and (3). To insert an element x into CF, if any of the two candidate buckets has an empty slot, CF stores the $\eta_x$ into one of the empty slots; otherwise, CF randomly kicks out one of the stored fingerprints $\eta_y$ to hopefully find an empty slot in its candidate bucket $B_c$, which can be calculated by the bucket index $B_{now}$ and fingerprint $\eta_y$, as shown in (4). The emptied slot will be occupied by $\eta_x$. If there exists empty slots in buckets $B_c$, the victim element $\eta_y$ will be stored in one of the empty slots; otherwise, this kick-out procedure will continues until the victim element gets a new allocated slot successfully or the reallocation time exceeds the threshold MAX, which implies a element insertion failure.

$$\eta_x = \text{fingerprint}(x) \quad (2)$$

$$\begin{cases} h_1(x) = \text{hash}(x) \\ h_2(x) = h_1 \oplus \text{hash}(\eta_x) \end{cases} \quad (3)$$

$$B_c = B_{now} \oplus \text{hash}(\eta_x) \quad (4)$$

With such a design, CF can also act as a synopsis data structure for membership testing. To test membership of element y, if either of the two candidate buckets contains the fingerprint $\eta_3$, a positive answer will be returned; otherwise, an answer indicating a non-member result will be returned. Similar to BF, the membership query in CF does not incur a false negative error, but may have a false positive rate, as shown in (5). Comprehensive evaluations demonstrate that CF can support adding and removing items dynamically while achieving a higher performance than the standard BF and its variants.

$$FPR_{CF} \leq 2b/2^f \quad (5)$$

However, the stability of CF for data streams has not been well researched. Conditional Cuckoo filter [27] modified CF for set membership testing given predicates on a precomputed sketch. Morton filter [3] makes CF faster and space-efficient via biasing, compression, and decoupled Logical Sparsity. Vacuum filter [9] utilized a table-based structure to store fingerprint to solve the membership testing tasks under dynamics, duplicate insertions and set resizing. MinCounter [8] selects the infrequently accessed buckets to alleviate the occurrence of endless loops in the data insertion.

Problem Statement

A data stream S many be abstracted as a sequence of elements, i.e., $S=\{x^{t_1}, x^{t_2}, \ldots, x^{t \to \infty}\}$. A main focus may be on the membership testing problem of the data stream within recent n elements, which can be denoted as $S_n$, where n is the number of interested elements. With the arrival of stream elements, the data synopsis may maintain the most recent n elements, i.e., inserting the new elements, evicting stale elements, and maintaining a stable performance of the synopsis data structure. Note that the membership testing problem of the recent data streams can be classified as the subproblem of membership testing on sliding windows [13]. The problem is thus defined: given a data stream S, performing membership testing on a window with length n, which is the union of last n items or the union of data items arriving in the last n time units. This abstraction is common and accurate for many stream applications. Inspired by SBF [12], an SCF is defined and the stability of the SCF is analyzed (i.e., the FPR reaches a non-trivial value as t→∞). Furthermore, the FNR of SCF when performing membership testing on data streams within a limited space is determined. Specifically, three core operations for SCF are considered: insertion, which locates two candidate buckets of the elements; update, which locates the slots in candidate buckets for new elements, (i.e. inserting the fingerprints of new elements while evicting stale elements), and query, which aims to perform membership testing based on SCF. When performing membership testing for the most-recent data stream elements, the SCFs are expected to: 1) maintain stability; 2) ensure a relatively high space occupancy utilization; 3) realize approximate time-sensitive update with guaranteed accuracy; and 4) incur little update overhead.

Stable Cuckoo Filter

Following the indexing strategy from CF, SCF stores the fingerprint $\eta_x$ into one of the candidate buckets, i.e., $h_1(x)$, $h_2(x)$, for any element x in the data streams. The candidate buckets may be determined using a hash of the element to be inserted, or by using a hash of the fingerprint. The hash function may be any hash function known in the art, such as, without limitation, secure hash algorithm (e.g., SHA256), Merkle—Damgård construction (e.g., MD5), cyclic redundancy checks (e.g., CRC32), etc. Unlike CF, SCF is configured to evict stale elements to store new elements, such that the filter is stable. When querying the membership of an element y, SCF directly checks both candidate buckets $h_1(y)$ and $h_1(y)$. A positive answer is returned if the fingerprint $\eta_y$ can be found; otherwise, a negative answer will be returned. Note that, because of the fingerprint collision and eviction operation, the query results of SCF may have false positive errors and false negative errors.

The SCF of the present disclosure focuses on making the CF no longer disposable. To this end, the update strategy should maintain the most recent elements and evict stale elements. The update strategy also utilizes a slot allocation scheme, as well as an eviction strategy. Specifically, the slot allocation strategy is used in inserting new elements; while the eviction strategy is used in removing stale elements in a time-sensitive manner Several update strategies are described in the present embodiment and may be used individually or in combination where the structure of the SCF is optimized accordingly. The performance of the update strategies in terms of the three rationales is also analyzed.

Random Update

A major limitation of applying SCF to data streams stems from limited space. With an increasing number of represented elements, fewer empty may be available. Thus CF may spend more resources to find an empty slot in the candidate buckets of victim elements during the reallocation procedure when applied to data streams. Moreover, the probability of insertion failure increases as fewer empty slots are available.

SCF naturally supports deletion operations by removing fingerprints directly without additional overhead. In a random update strategy, elements may be randomly deleted from the SCF to create additional empty slots for elements to be inserted. The random update strategy is simple but stochastic and does not consider when and where to delete elements. Additionally, the cleared slots may not guarantee available slots for new elements. While the random update strategy may decrease the probability of insertion failure, the random update strategy fails to guarantee high space efficiency, exact time-sensitive updates, and successful insertions.

Although random update incurs little additional overhead by leveraging SCF's efficient deletion operation, simply random evicting elements cannot ensure rationales (1) and (3). SCF must maintain a low space occupancy to guarantee the successful insertion of the new elements when utilizing a random update strategy. As such, additional update strategies may be used in combination with or instead of the random update strategy in utilizing the deletion function of CF to evict stale elements accurately and guaranteeing a high space occupancy.

Insertion Failure Update

The insertion failure update strategy may be used to randomly delete an element from the candidate buckets when one element cannot be successfully inserted. An element cannot be successfully inserted if, for example, the candidate bucket is full, the kick-out reallocation strategy fails to find a vacant bucket, etc. The insertion failure update strategy is simple but may be inefficient if utilizing the kick-out reallocation strategy from the standard CF. A worst case may be when MAX reaches 500 and no vacant bucket is found [1], thus CF is considered too "full" to insert. In the worst case, for every element to be inserted, before performing the insertion failure update operation, the reallocation operation may be performed up to 500 times, which in many cases may be time-consuming and unnecessary.

In addressing the worst case scenario, the insertion operation after SCF gets into the "full" state may be simplified. Specifically, once insertion failure occurs, incoming elements may be inserted by simply deleting one element of the candidate buckets. As such, SCF can maintain the "full" state continuously and guarantee the successful insertion of new element. Additionally, the insertion operation becomes lightweight and has a constant time consumption when CF gets into the "full" state. At the same time, a high space efficiency can also be guaranteed. However, the victim element is confined to being in the candidate buckets of the element to be inserted. The insertion failure update strategy may be used to evict recently inserted elements; thus, time-sensitive updates are not achieved. Performance analysis of the insertion failure update strategy will further be described below.

Insertion failure update guarantees a relative high space occupancy and realizes successful insertion by updating locally. However, the evicting strategy of insertion failure update is random and the update may not be completed instantly. Thus, the insertion failure update ensures rationales (1) and (3), but does not ensure rationale (2).

Scanning Strategy

Figure 3A:
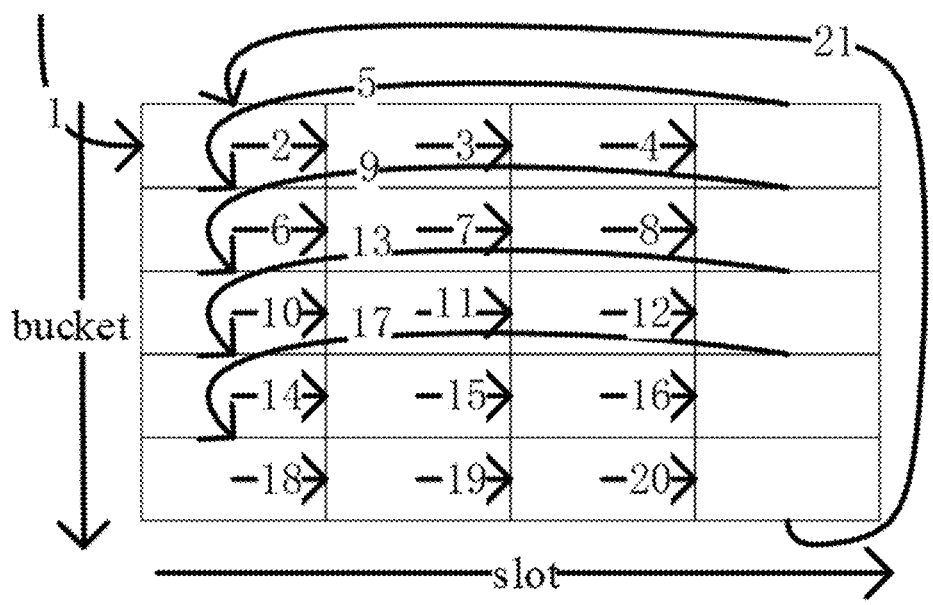
Figure 3B:
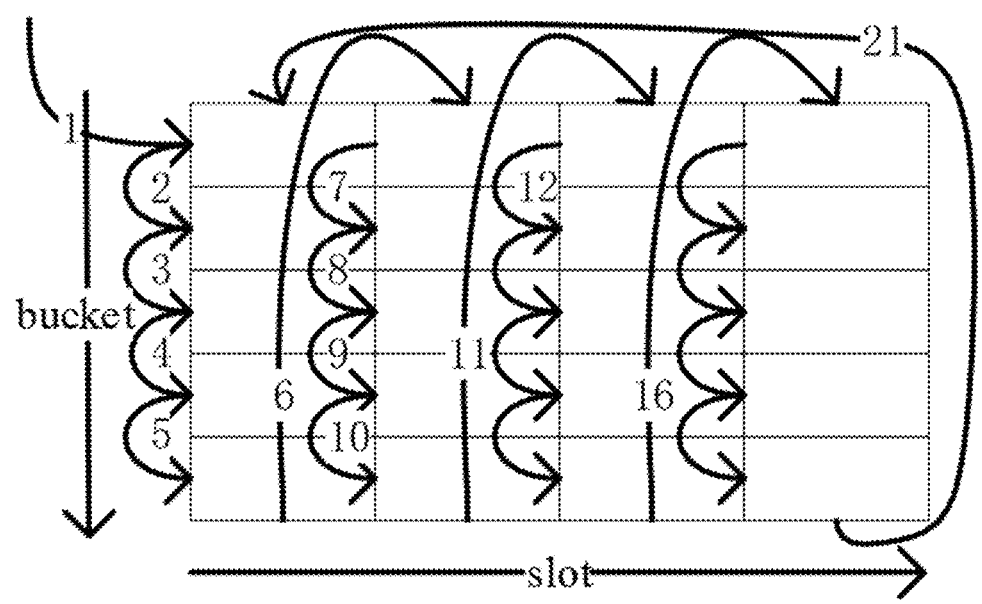
Figure 4:
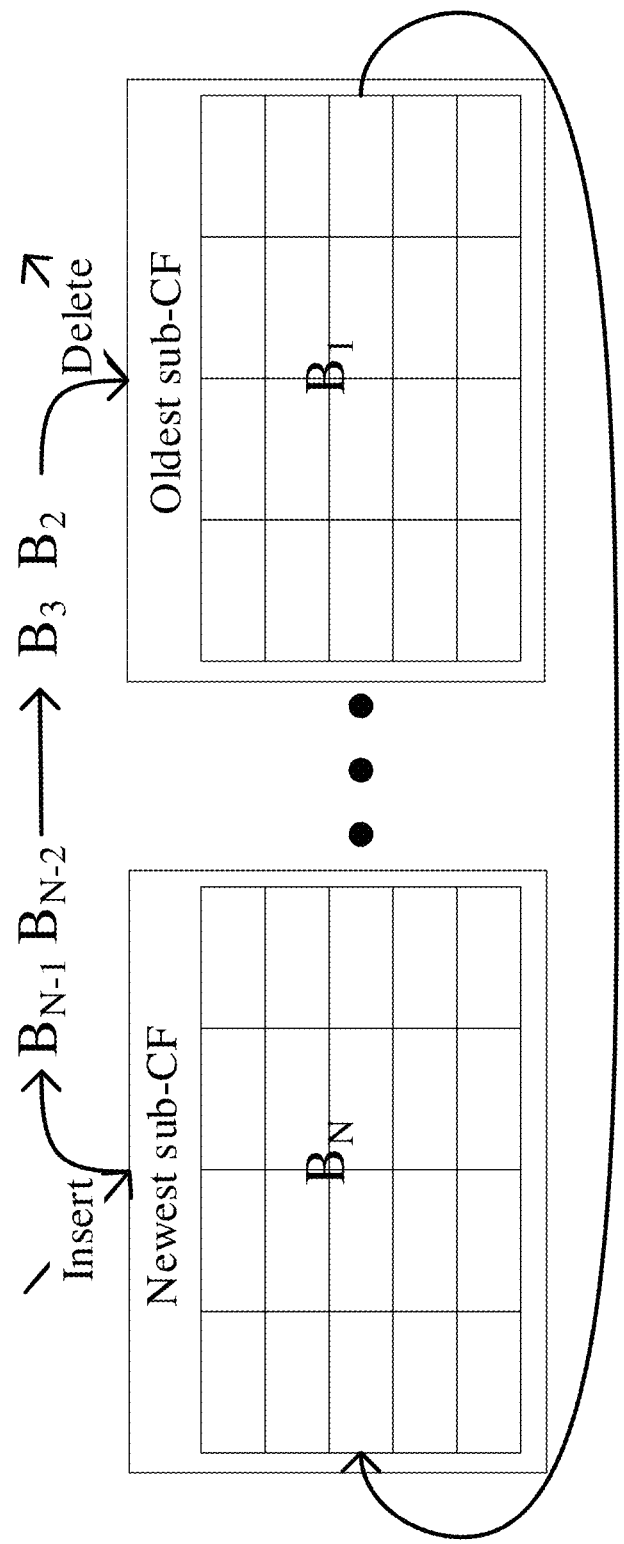
FIG. 4 illustrates an exemplary block design strategy, in accordance with an embodiment of the present disclosure.

Insertion failure update can provide high space efficiency and incur little additional overhead but cannot guarantee time-sensitive updates. Inspired by Sliding sketches [13], an alternative memory-access friendly strategy is a scanning update strategy. As illustrated in FIG. 3A, the scanning update strategy utilizes a systematic deletion strategy. After the space occupancy a of the SCF reaches a given threshold $T_\alpha$, a scanning program may be triggered. Inspired by the insertion failure update strategy, in one embodiment, the scanning update strategy may also be optimized by omitting the reallocation strategy to reduce computation overhead. Specifically, an insertion of a new element may be accompanied with one designated slot checking and, if necessary, one element deletion. If, after the designated slot checking, an element is stored in the slot of the candidate bucket (i.e. the next slot is not vacant), the stored element may be deleted and replaced with the new element; otherwise, the new element may simply be inserted. A scanning pointer may be used to track slots being checked and may use a slot traversal strategy to perform the designated slot checking. When using the slot traversal strategy, as depicted in FIG. 3A, the scanning pointer may start traversal from a first slot of a first bucket, continue to a second slot of the first bucket, eventually reach a last slot of a last bucket sequentially of the SCF (e.g. the slot traversal strategy may traverse the SCF according to: B [0][0], B [0][1], . . . , B [m−1] [b−2], B [m−1][b−1]), and recycles again with insertion of new elements. The slot checking may be used to determine if a working slot (i.e., the slot referenced by the scanning pointer) and a next slot (i.e., the next slot according to the slot traversal strategy) are vacant.

By utilizing the scanning strategy, SCF can fresh the elements stored with the little overhead of maintaining the scanning pointer. However, the deletion operations that occur within one bucket sequentially may waste too much chance to make available space for the new elements. To guarantee the successful insertion of new elements, the threshold Ta may be set low to keep the filter "full". However, the scanning strategy also cannot support rationale (2) and distinguish the stored elements in the time dimension.

Although scanning strategy provides a manageable update strategy, the scanning strategy may not provide a balanced chance for each bucket to remove stale elements. Long term, each bucket has an equal chance to be cleared. However, short term, a series of update operations within one bucket may waste update opportunities for other buckets.

Skip Scanning Update

In addressing the deficiencies of the scanning update strategy, a skip scanning update strategy may jointly consider slot allocation and eviction strategies. Specifically, when inserting elements into the SCF, the latest emptied slot in its candidate buckets may be the first slot allocated to store the fingerprint. For example, without limitation, the empty slots in bucket B [1] are occupied according to the sequence B [1][0], B [1][1], B [1] [2], B [1] [3] circularly. The emptied slots are acquired by the skip scanning update strategy according to a bucket traversal strategy to scan slots according to B[0][0], B[1][0], . . . , B[m−1][0], B[0][1], . . . , B[m−1][1], . . . , B [m−1] [b−1] sequentially and circularly. When the space occupancy of the SCF reaches the threshold $T_\alpha$, the skip scanning update strategy may be triggered, which is performed together with insertion procedure. Similar to the insertion failure update strategy, the skip scanning update strategy may omit the reallocation strategy during insertion to reduce computation overhead. When using the skip scanning update strategy, the SCF can guarantee time-sensitive deletion of the stalest elements in most cases and have a lower space efficiency at the cost of the little additional overhead associated with maintaining a step-b scanning pointer to reference a working slot, where the step-b scanning pointer is used to reference a working slot according to the bucket traversal strategy. The space occupancy of the SCF when using the skip scanning update strategy may be stable even while updating with incoming elements.

By allocating update chances into each bucket sequentially, SCF can provide available space for new elements with a high probability of success. By the skip scanning update strategy, the SCF may guarantee rationale (2) to some extent. Short term, update operations are equally shared by each bucket. However, the space occupancy may be maintained, for example, without limitation, at around 75% to ensure the probability of a successful insertion.

Block Design

A more exact time-sensitive SCF can be designed by dividing the SCF into multiple sub-CFs, i.e., $B_1, B_2, \ldots, B_N$. Specifically, new elements may be inserted into sub- CF $B_1, \ldots, B_{N-1}$ sequentially. The insertion procedure may be similar to DCF [4] and DBF [26]. When inserting new elements into the freshest sub-CF $B_N$, the oldest sub-CF $B_1$ may be evicted. The block design strategy may also use one or more of the aforementioned update strategies, such as random eviction, scanning strategy and skip scanning strategy. After the freshest sub-CF gets into the "full" state, the stalest sub-CF will be cleared with a high probability. For example, without limitation, the newly cleared sub-CF $B_1$ may become the freshest sub-CF, and the sub-CF $B_2$ may become the stalest sub-CF. The update strategy will be performed on the freshest and stalest sub-CFs in the next epoch. This procedure continues along with the insertion of streaming elements.

The block design strategy can limit the update operations locally in a specific space, which achieves rationale (2). Specifically, by separating the elements into sub-CFs, SCF can maintain a space occupancy for example, without limitation, of approximately 75% as there may always be a stalest sub-CF from which to evict stale elements. However, membership query operations must be performed on all sub-CFs, which may increase the complexity of element query and deletion.

Local Time-Sensitive Update Strategy

Figure 5A:
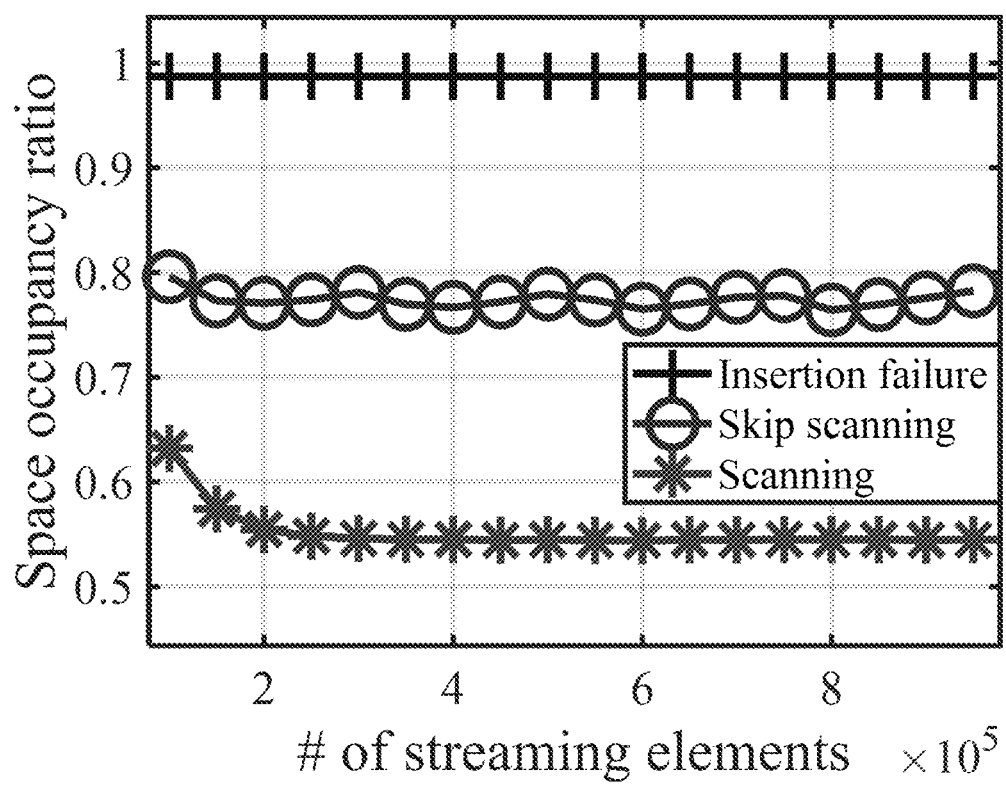
Figure 5B:
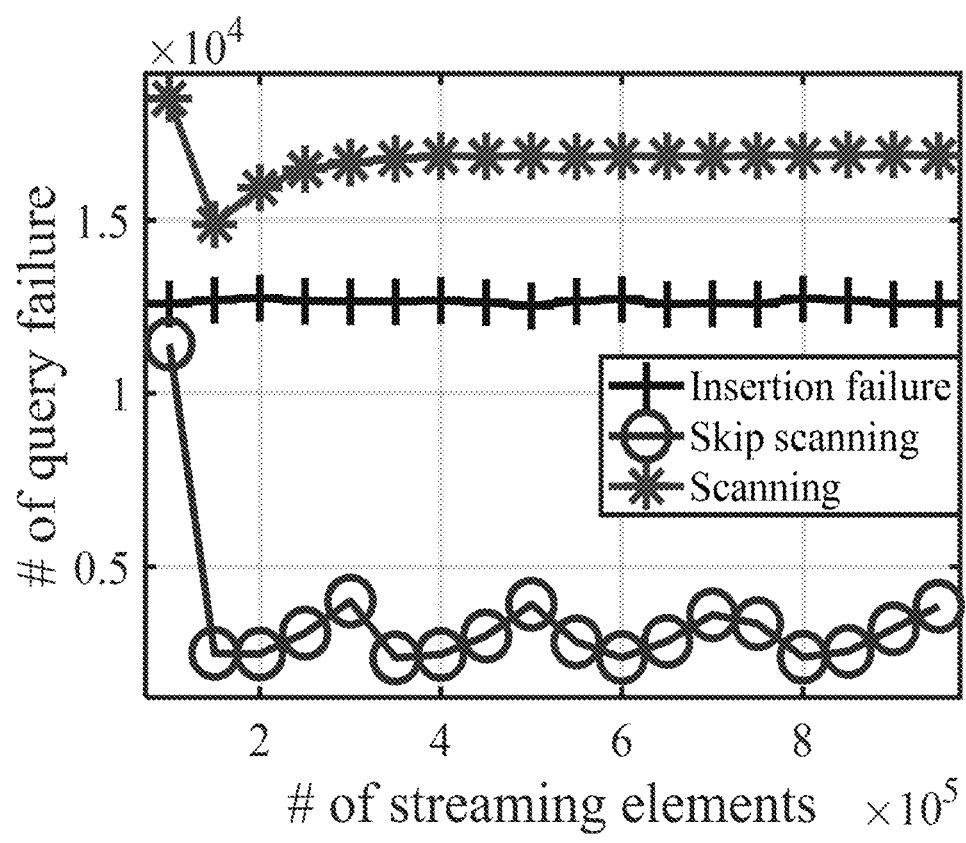

As shown in FIGS. 5A-5B, the insertion failure update strategy may result in high space occupancy, as well as potential query errors. The scanning strategy maintains low space occupancy, while incurring more query errors. Only the skip scanning strategy can maintain a low error rate and a moderate space occupancy. Inspired by the above five update strategies, a local time-sensitive update strategy may be used to satisfy all the three rationales simultaneously. The word "local" means the SCF may confine time-sensitive updates within a single bucket. The core idea is to encode the time information into the SCF. Thus when there is no available space for new elements, the SCF may evict the stalest elements from candidate buckets according to the time information. The local time-sensitive update strategy is described with reference to Algorithm 1, Algorithm 2, Algorithm 3, and the corresponding description below.

Figure 6A:
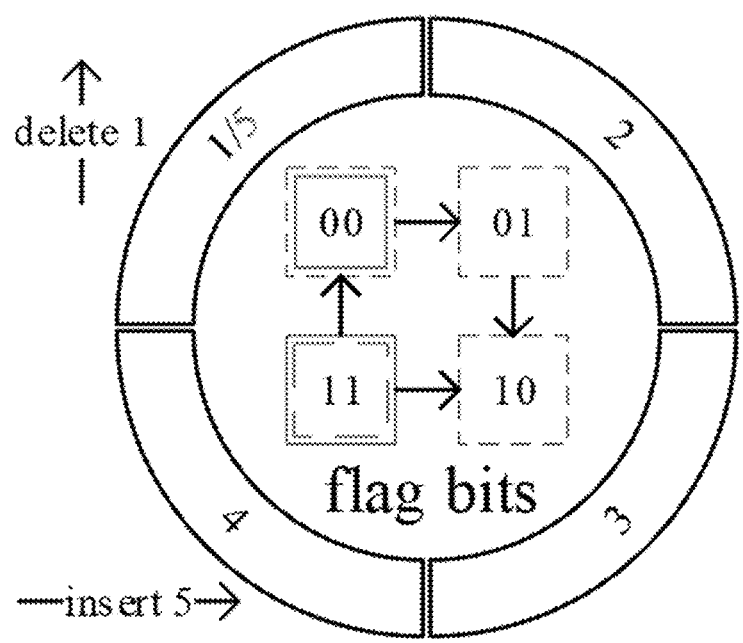
Figure 6B:
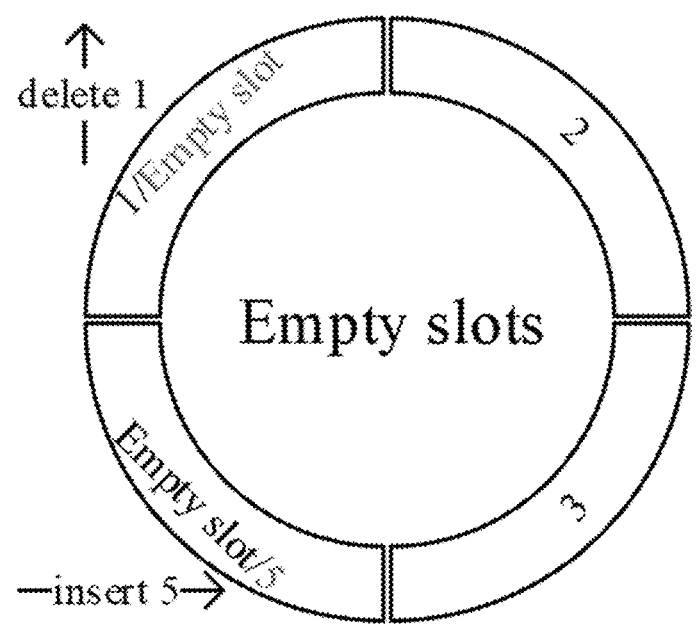
Figure 6C:
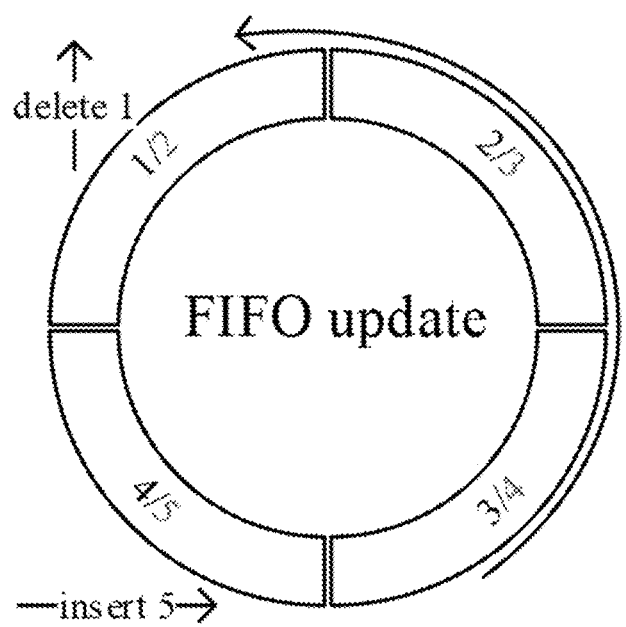
Figure 9A:
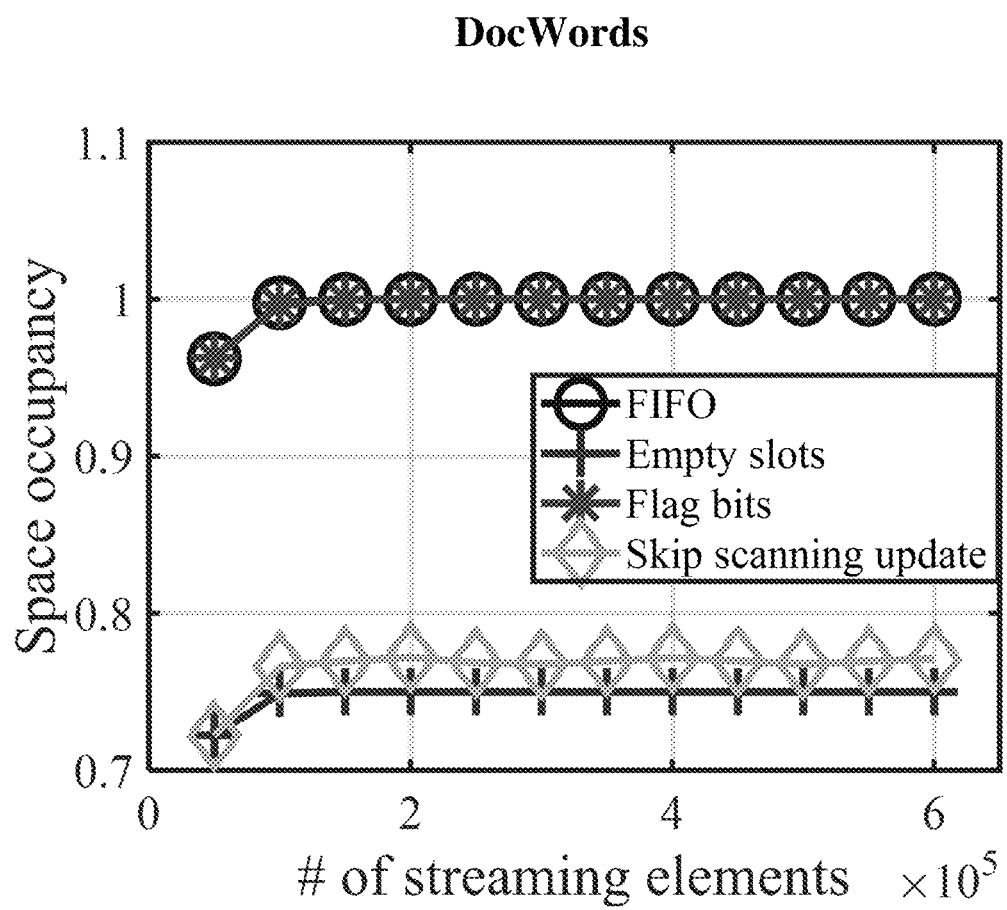
Figure 9B:
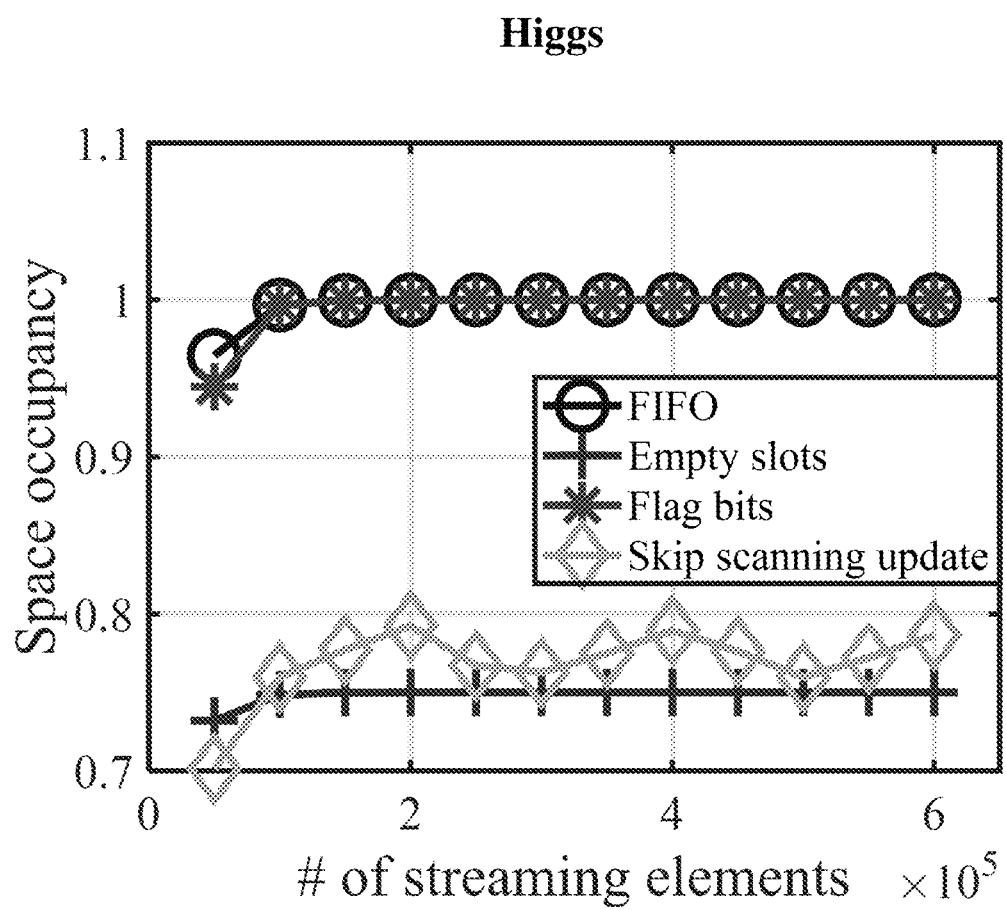
Figure 9C:
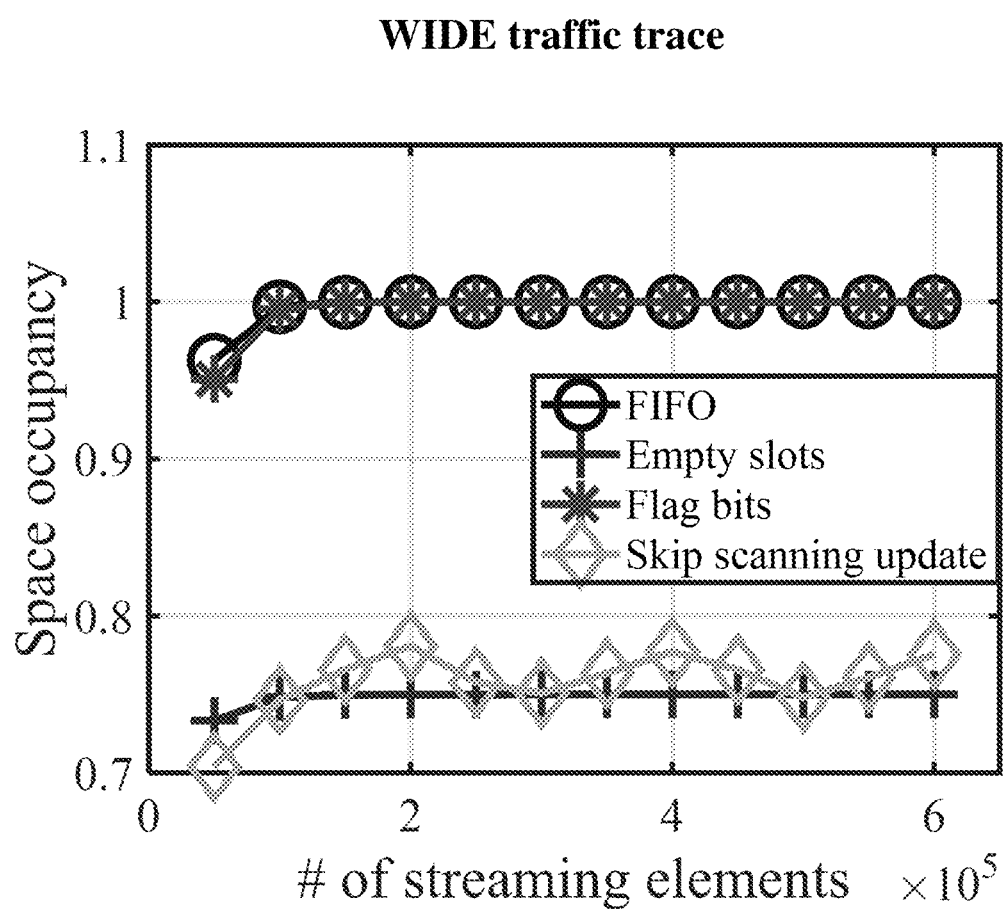
Figure 9D:
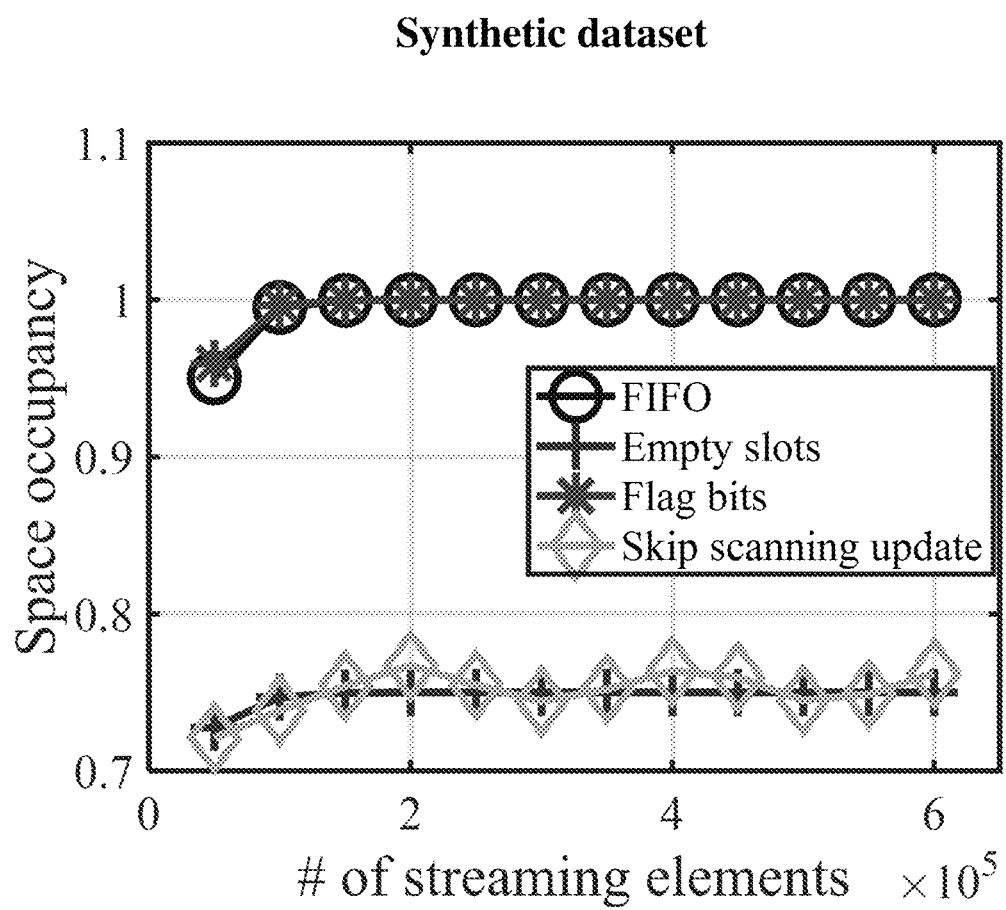
Figure 10A:
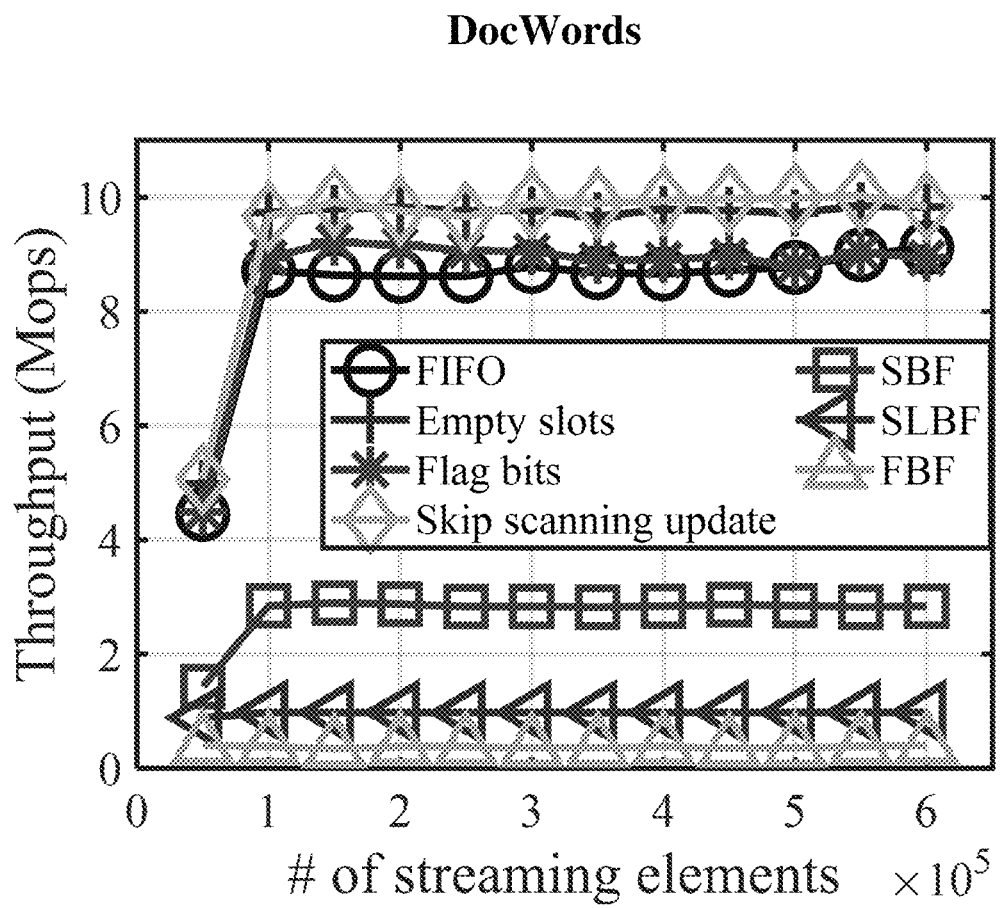
Figure 10B:
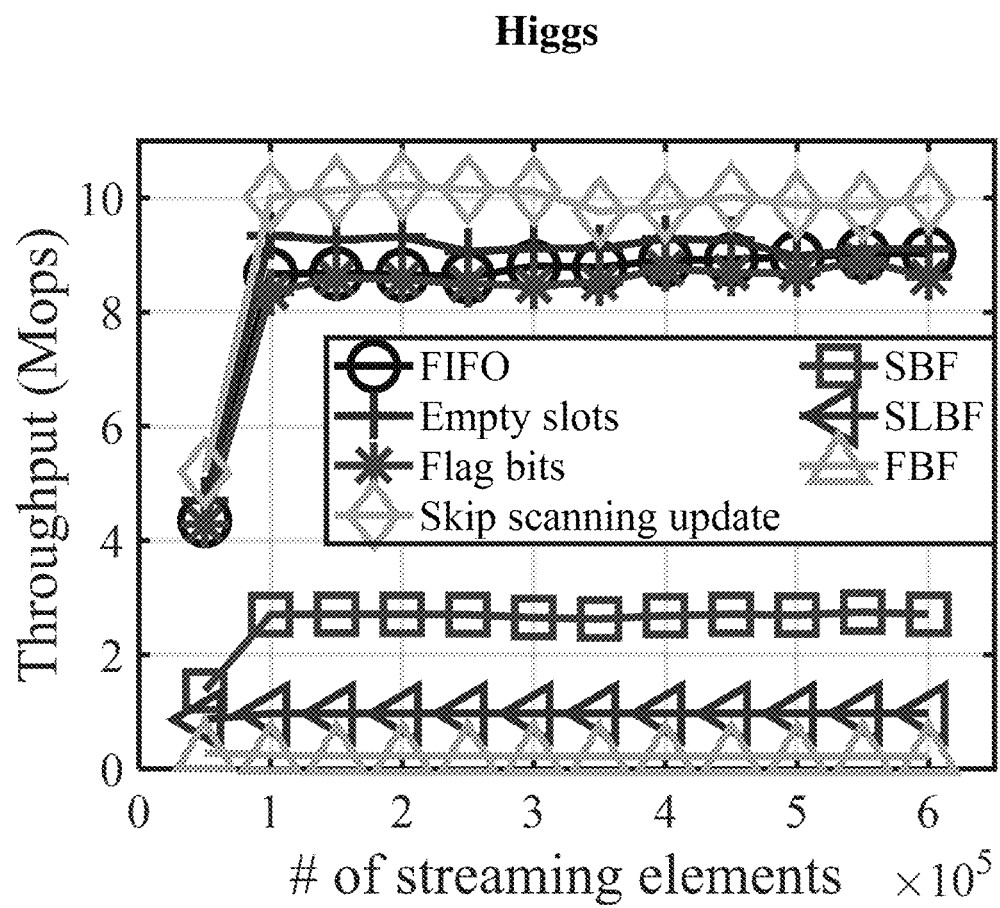
Figure 10C:
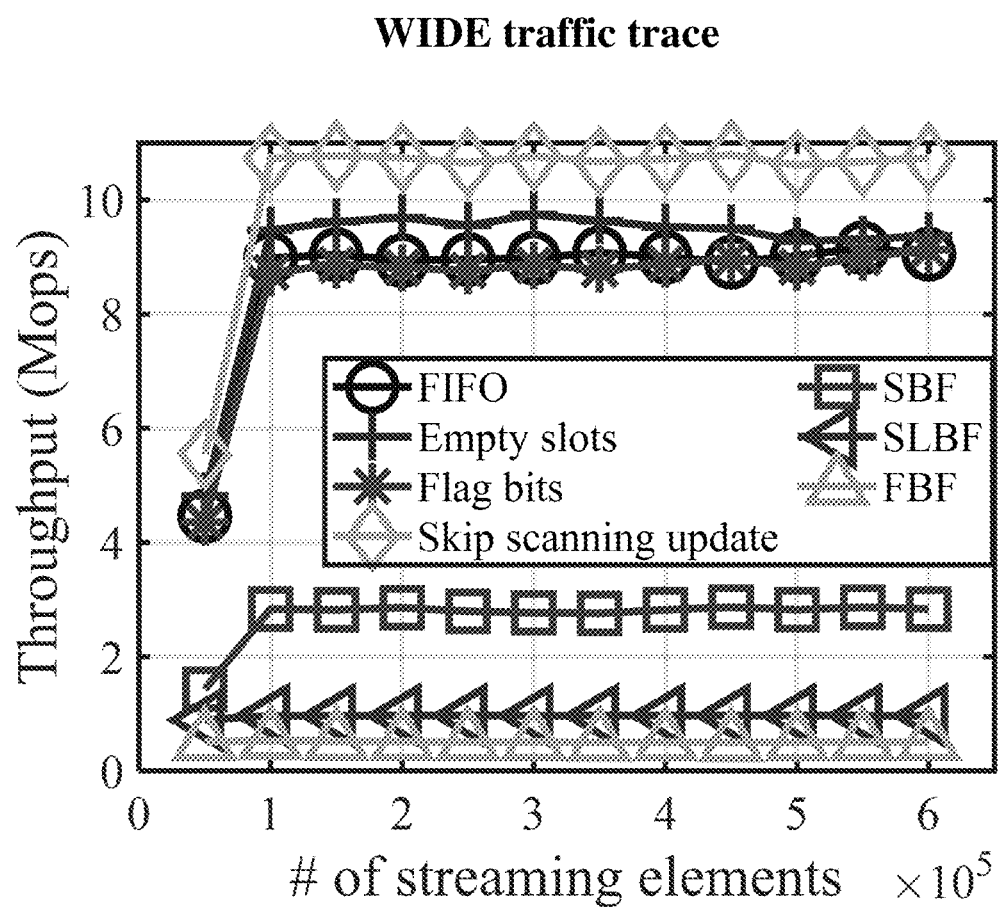
Figure 10D:
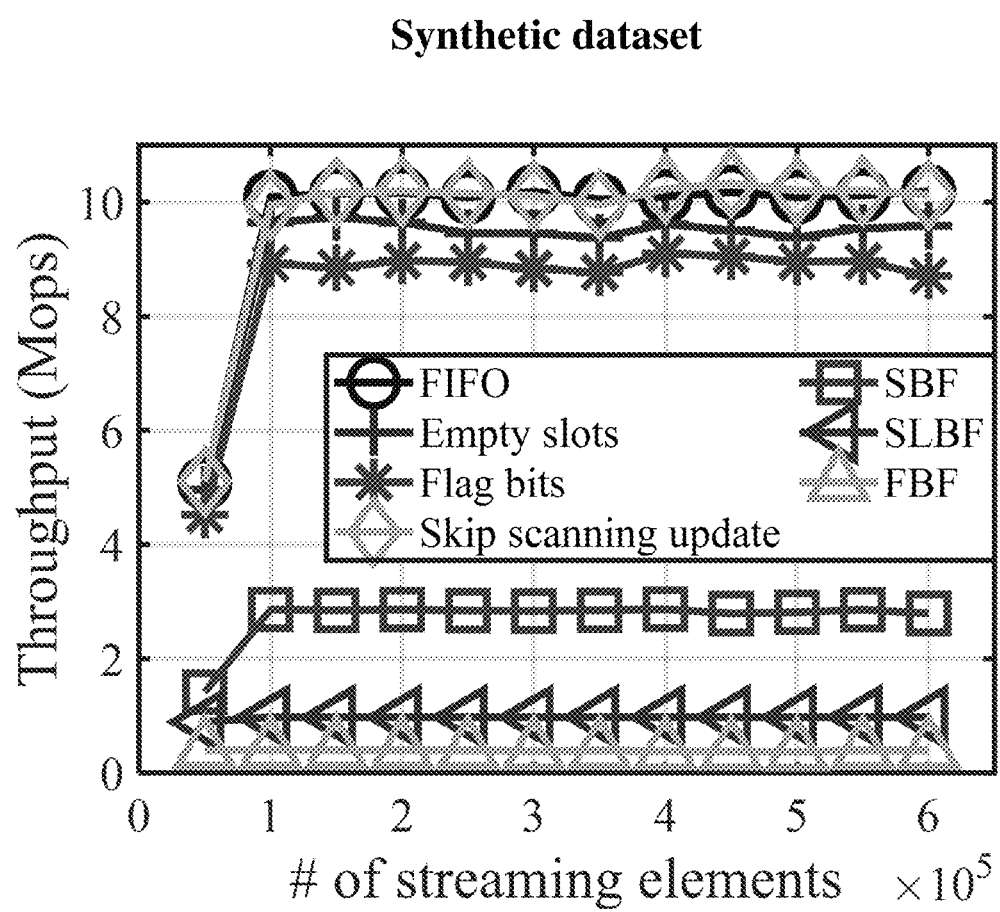
Figure 11A:
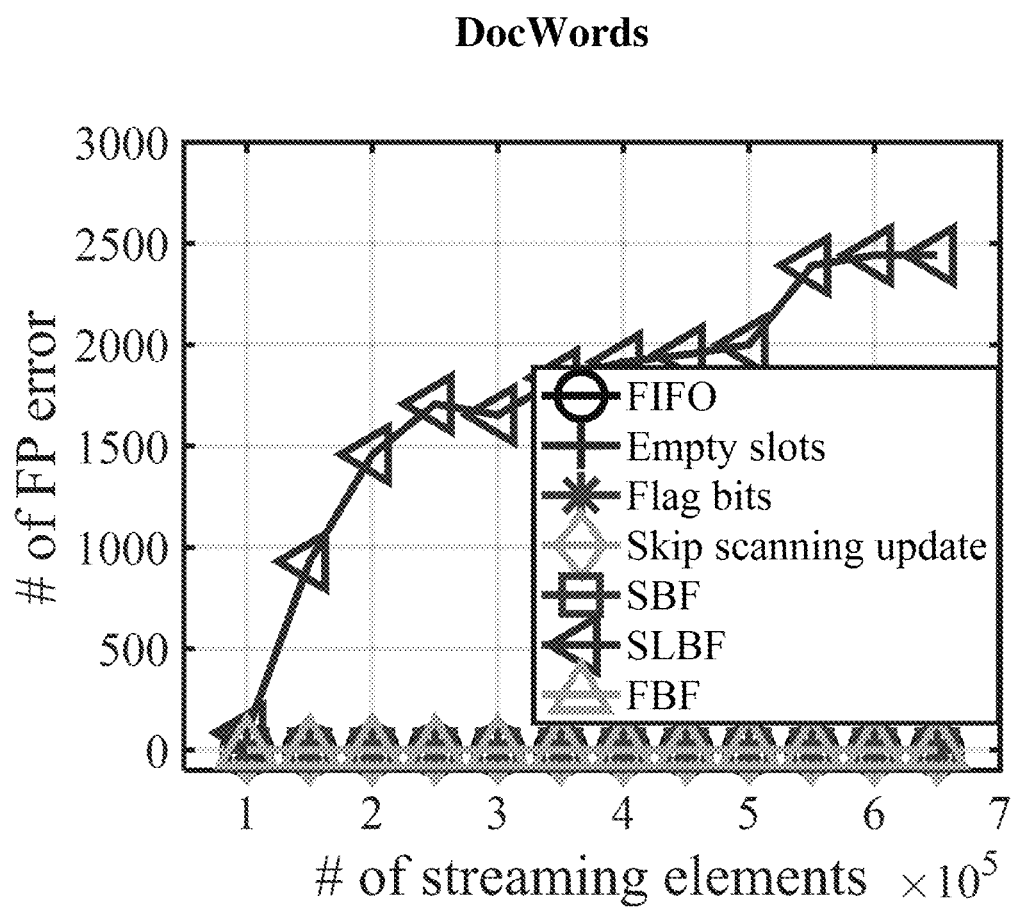
Figure 11B:
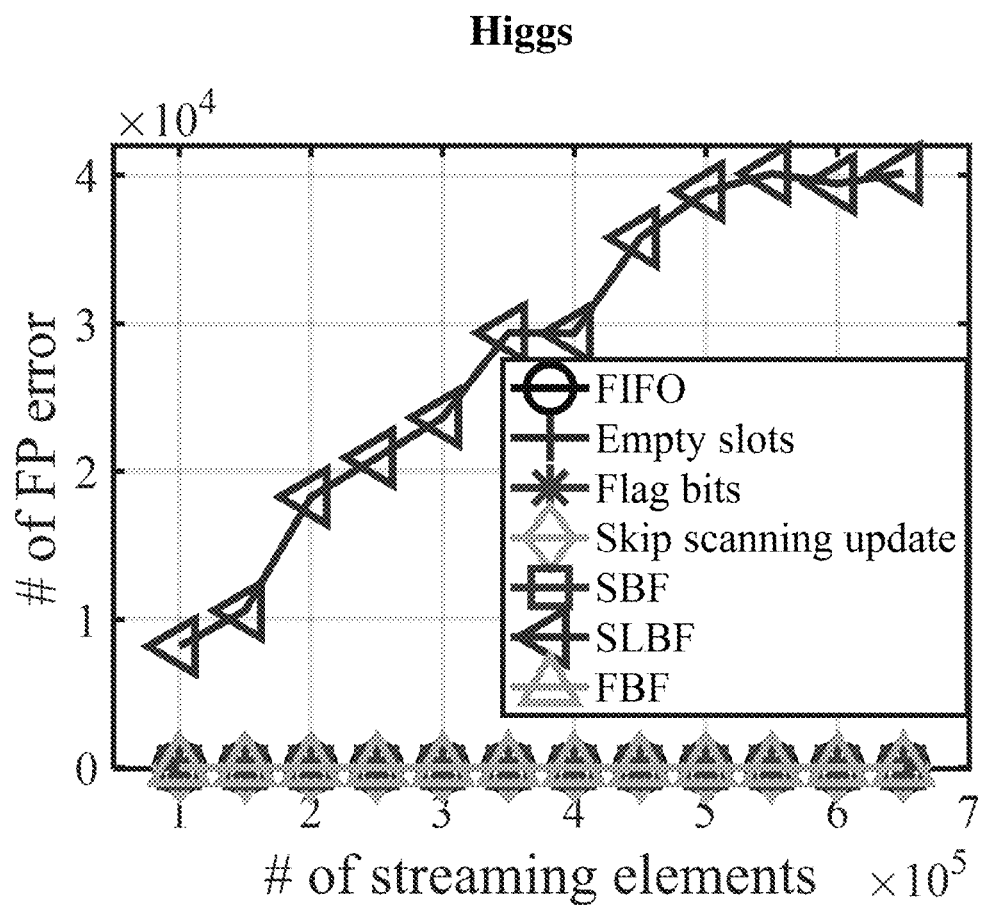
Figure 11C:
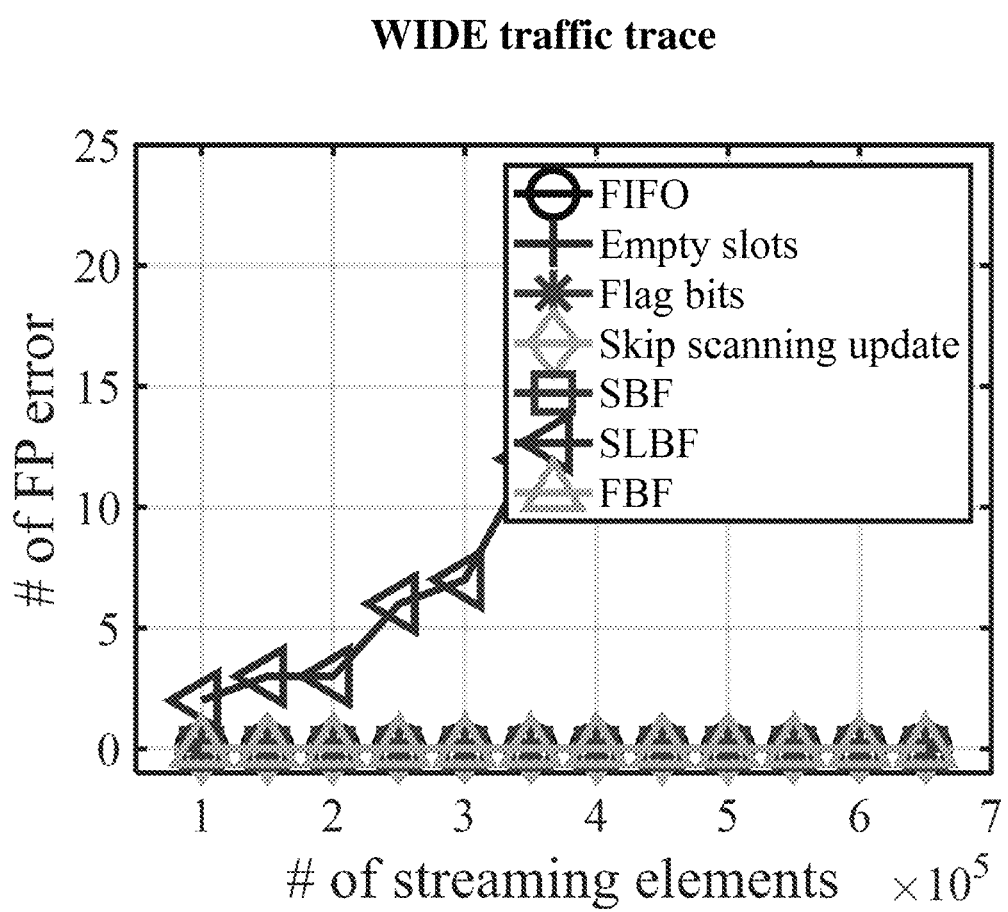
Figure 11D:
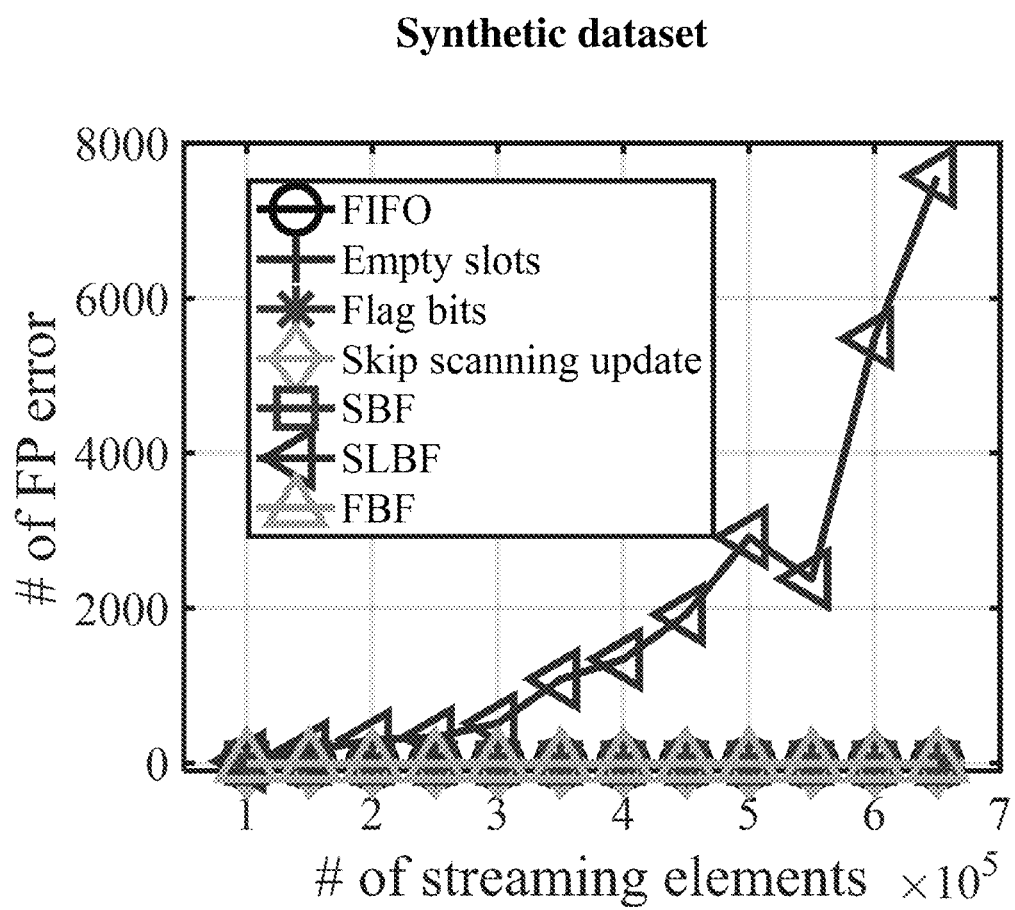
Figure 12A:
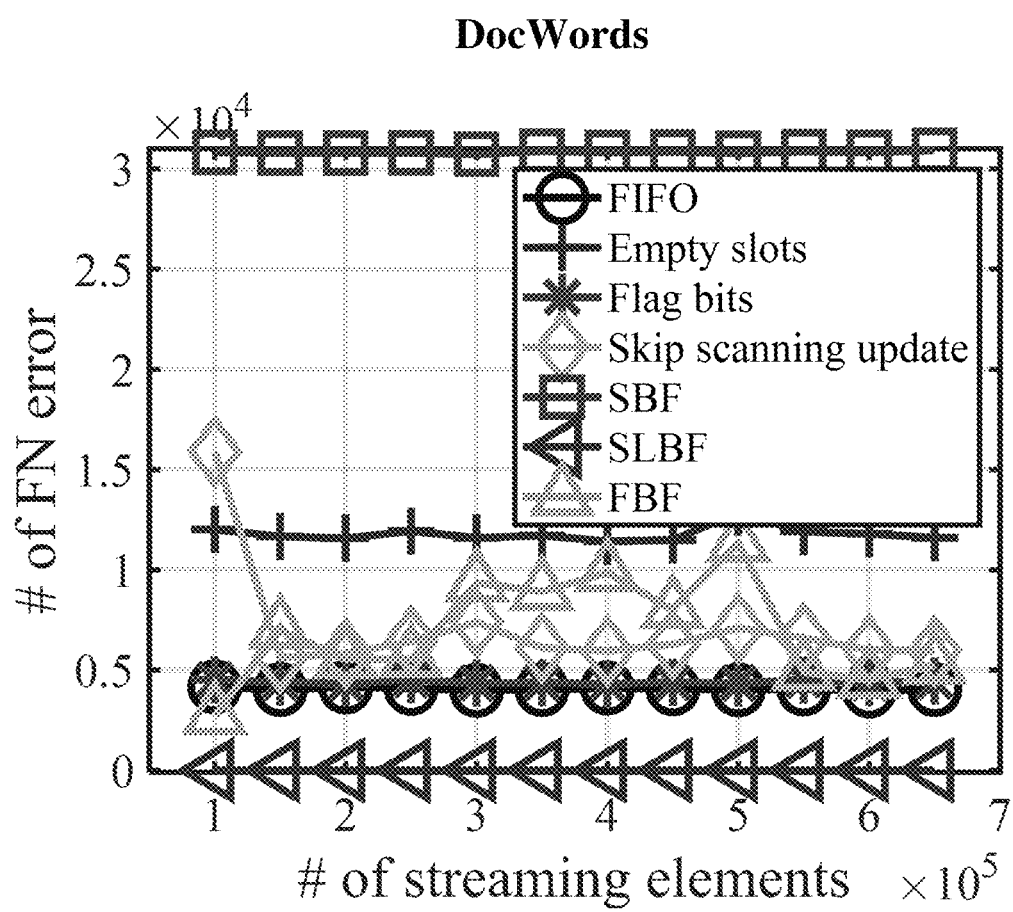
Figure 12B:
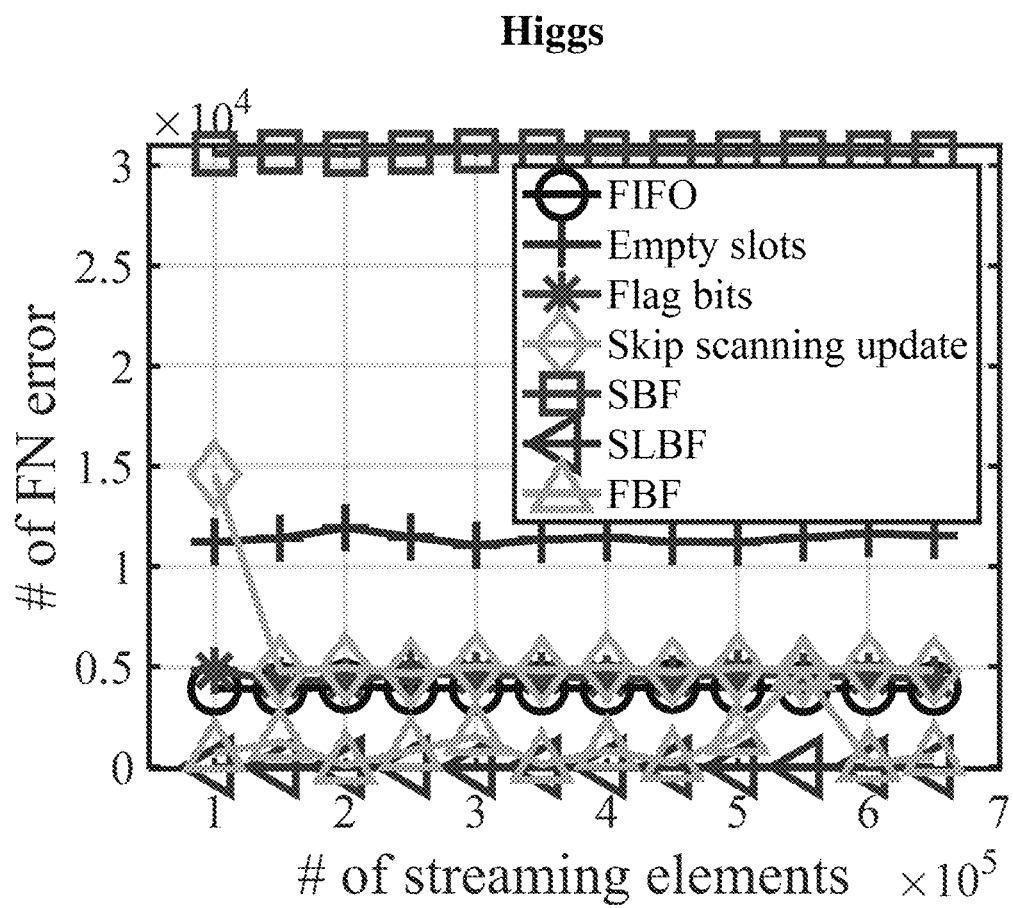
Figure 12C:
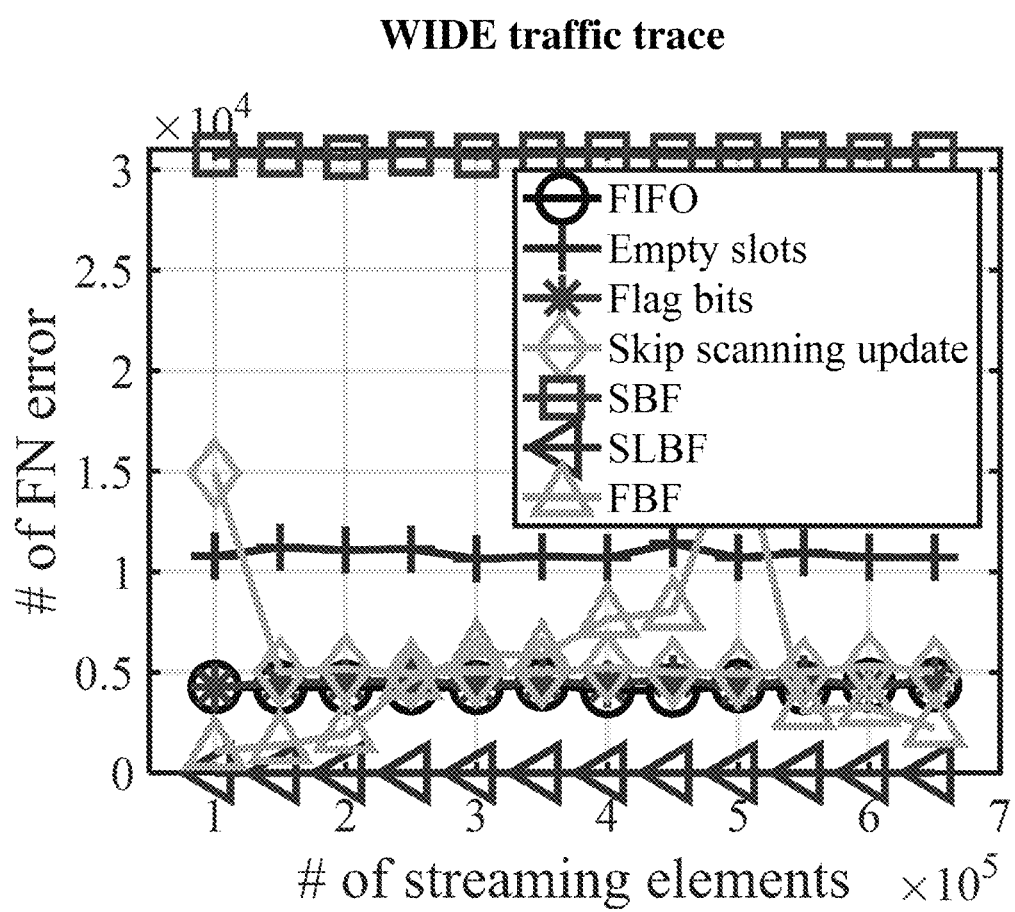
Figure 12D:
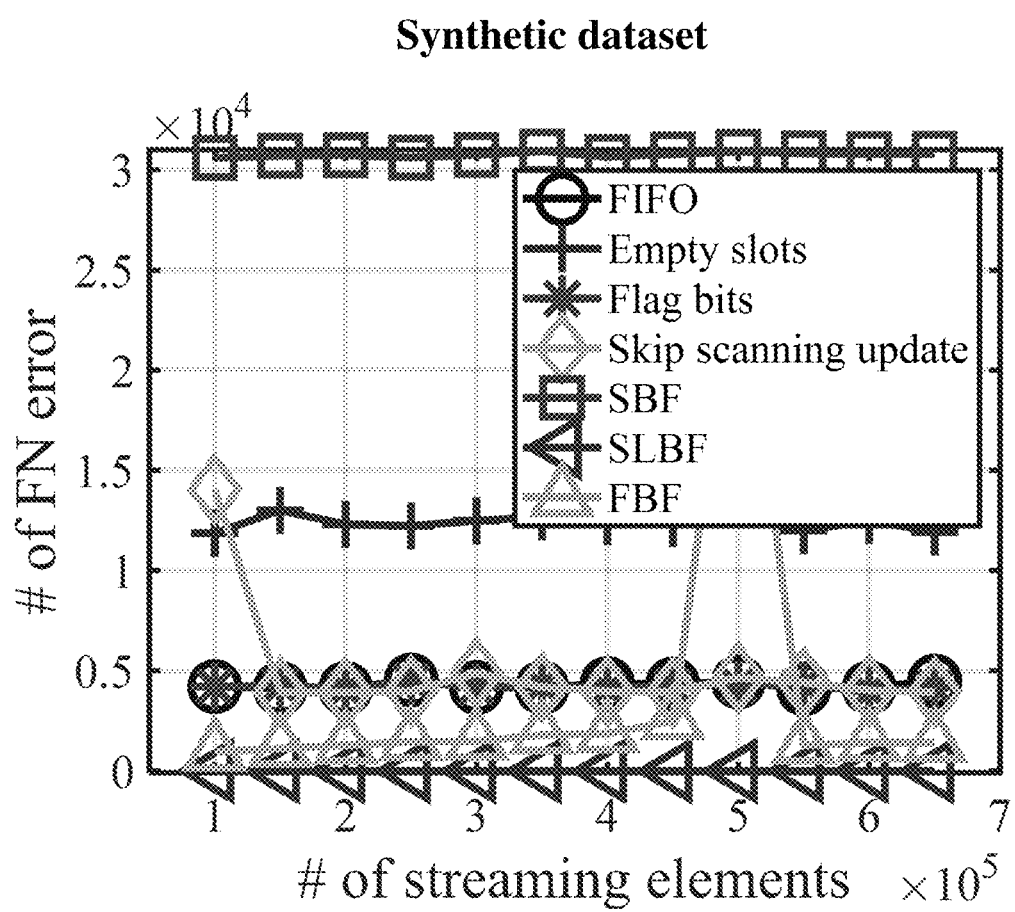
Figure 13A:
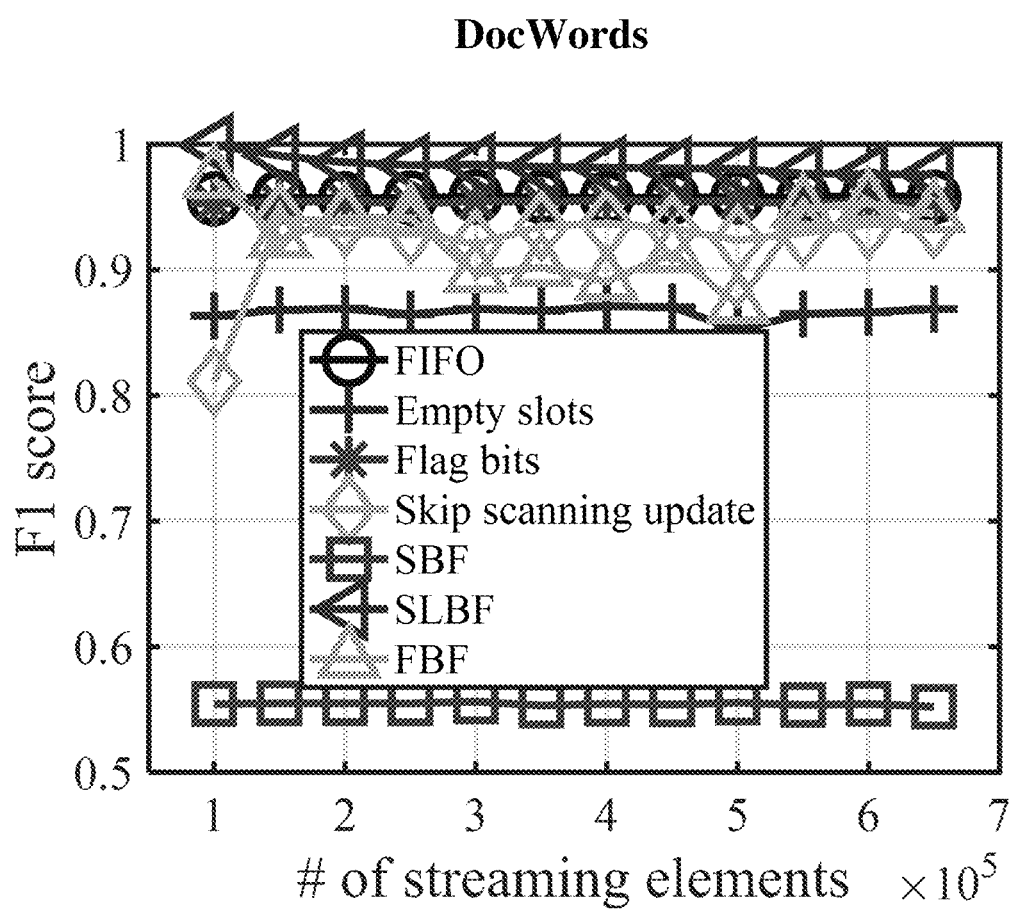
Figure 13B:
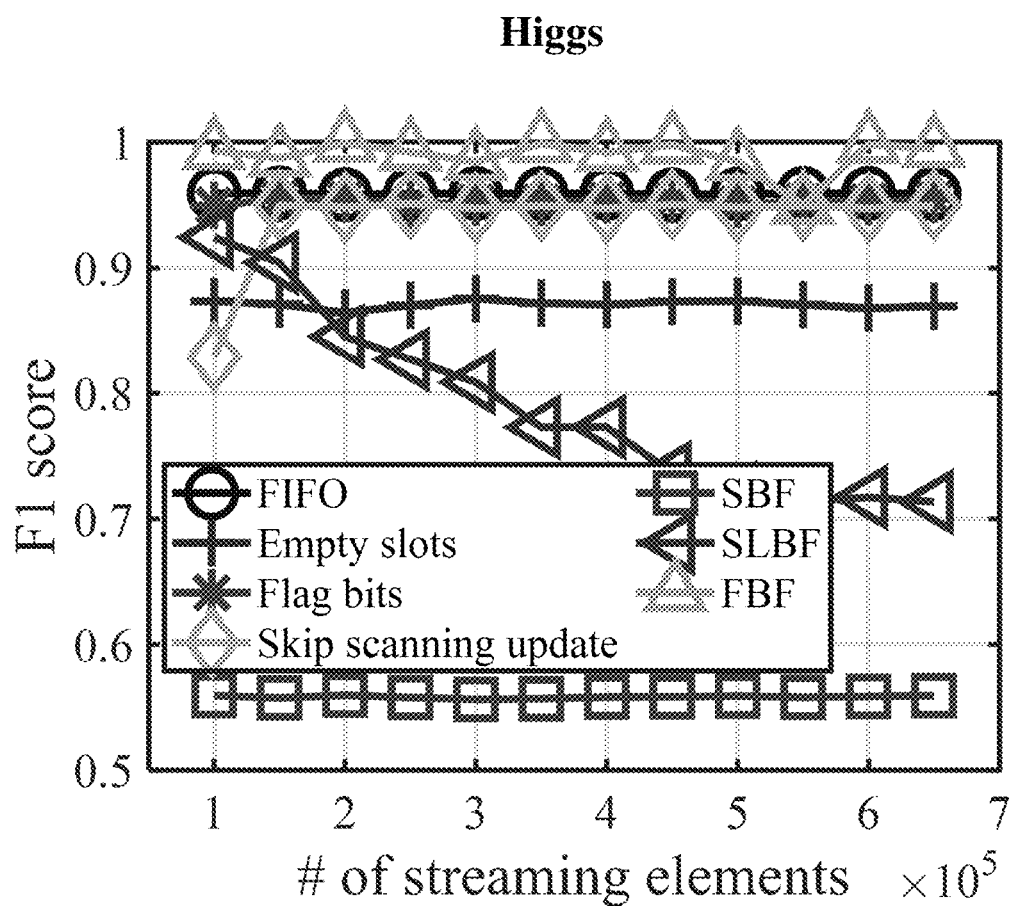
Figure 13C:
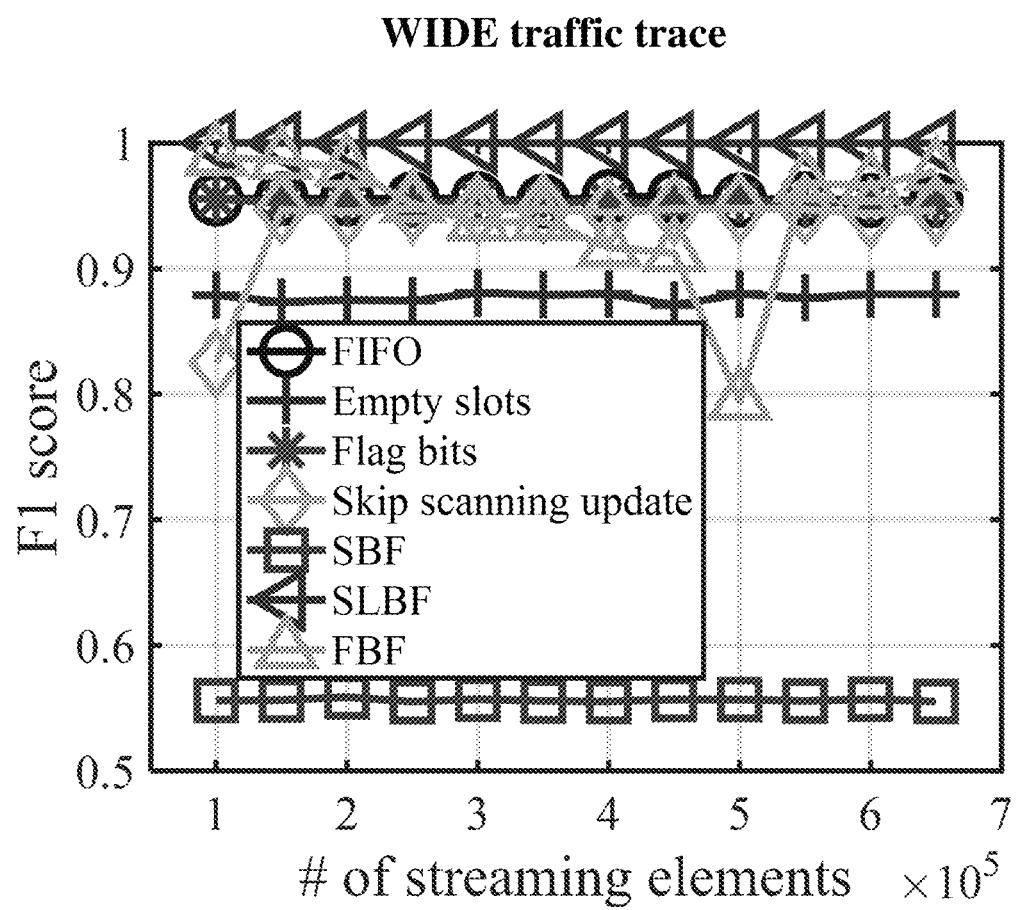
Figure 13D:
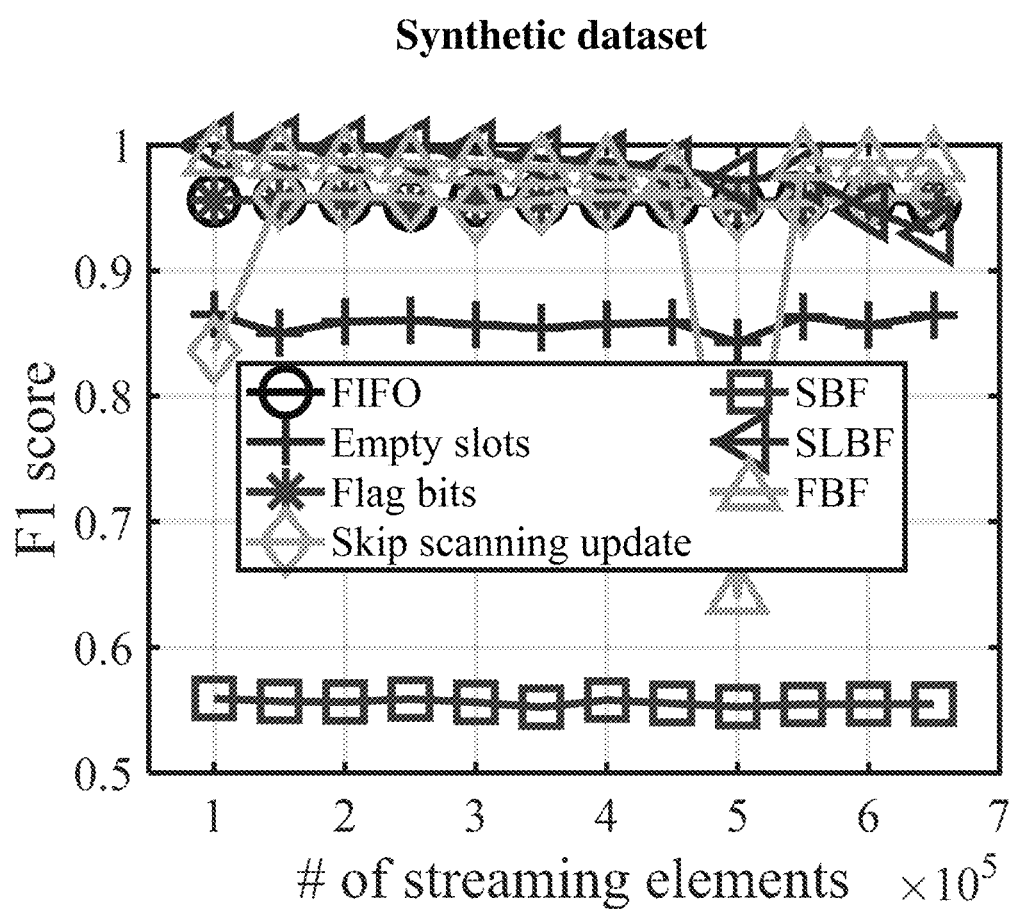

As illustrated in FIGS. 6A-6C, three approaches may be used to encode the time information with/without additional space overhead for a candidate bucket with four slots. As will be appreciated by one skilled in the art, the examples shown in FIGS. 6A-6C are purely exemplary, and the three approaches for the local time-sensitive update strategy may be used in SCFs having buckets with a greater or lesser number of slots. For example, without limitation, as shown in Algorithm 1, by augmenting flag bits in each bucket, where the flag bits may be the index of the last updated slot. Specifically, SCF may insert a new element into a target slot where the target slot is determined to be the stalest slot by referencing the flag bits (i.e. the target slot has an index of (flag+1)% b). The flag bits may then be updated with the index of the new element such that the flag bits are maintained to reference the last updated slot. As such, SCF can maintain a high space occupancy and ensure time-sensitive updates while incurring little additional space overhead.

---

Alogorithm 1 Flag bits update strategy

Input: SCF, new element x
1: $h_1$ (x) = hash (x)
2: $h_2$ (x) = $h_1$ (x) $\oplus$ hash ($\eta_x$)
3: i = $h_1$ or $h_2$

---

Alogorithm 1 Flag bits update strategy

4: B[i](B[i] · flag + 1)%b] = $\eta_x$
5: B[i] · flag = (B[i] · flag + 1)%b

---

Alternatively, in an empty slots update strategy, each bucket can maintain an empty slot to encode the time information as shown in Algorithm 2. As such, SCF may guarantee that, for each update operation, the new element is inserted into the empty slot. A next slot (i.e. B[i][j+1)% b)] may then be cleared as the new empty slot. However, the empty slots update strategy incurs a relatively low space efficiency, as an empty slot must be maintained for each bucket of the SCF.

---

Alogorithm 2 Empty slots update strategy

Input: SCF, new element x
1: $h_1$ (x) = hash (x)
2: $h_2$ (x) = $h_1$ (x) $\oplus$ hash ($\eta_x$)
3: i = $h_1$ or $h_2$
4: Find the first empty slot B[i][j] in B[i]
5: B[i][j] = $\eta_x$, B[i](j + 1)%b) = 0

---

In a first in first out (FIFO) update strategy, the SCF may update the candidate bucket as a queue upon insertion (i.e. the stored elements in each bucket may be updated with a FIFO approach). Specifically, as shown in Algorithm 3, in each bucket, the earliest inserted element is the first to be evicted. The buckets of a candidate bucket may be maintained as a FIFO queue based on insertion order (e.g., B[i][0] is the earliest inserted element, while B[i][b−1] is the latest inserted element, where b is the number of slots). When inserting a new element into a bucket, each slot of the candidate bucket may be updated with a next latest inserted element such that the FIFO nature of the FIFO update strategy is maintained. When referencing a specific slot of the candidate bucket, the next latest inserted element is the element inserted into the candidate bucket directly after the element in the specific slot. For example, the next latest inserted element of B[i][0] is B[i][1], the next latest inserted element of B[i][1] is B[i][2], the next latest inserted element of B[i][b−2] is B [i] [b−1], etc. After each slot is updated with the next latest inserted element, the next element may be inserted into the insertion slot of the candidate bucket, wherein the insertion slot is the slot of the candidate bucket storing a fingerprint of the latest inserted element. In a candidate bucket B with b slots, the insertion slot is indexed as B[i][b−1]. As such, the FIFO update strategy encodes time information in each bucket by maintaining each bucket as a FIFO queue, allowing for the stalest element of a candidate bucket to be evicted when a new element is inserted into a full bucket.

---

Alogorithm 3 FIFO update strategy

Input: SCE new element x
1: h (x) = hash (x), $h_2$ (x) = $h_1$ (x) $\oplus$ hash ($\eta_x$),
   i = $h_1$ or $h_2$
2: for 0 ≤ j < b − 1 do
3:     B[i][j] = B[i][j + 1]
4: B[i][b − 1] = $\eta_x$

---

The local time-sensitive update strategy may guarantee that the three rationales are met by only updating elements in a local bucket. The theoretical analysis is detailed below.

Implementation

Figure 14:
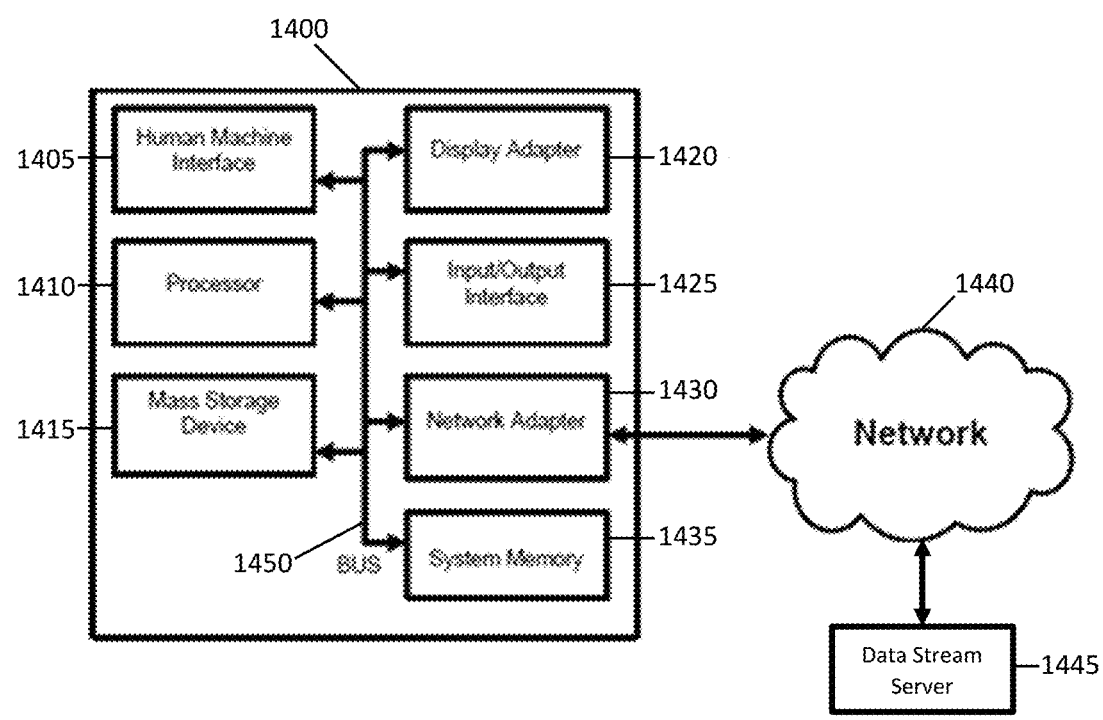
FIG. 14 illustrates an exemplary system for implementing a stable cuckoo filter, in accordance with an embodiment of the present invention.

With reference to FIG. 14, system 1400 may be used to implement the SCF for membership testing of data streams. System 1400 may include, for example, without limitation, human machine interface 1405, processor 1410, mass storage device 1415, display adapter 1420, input/output interface 1425, network adapter 1430, and system memory 1435 interconnected via bus 1450.

Human machine interface 1405 may be configured to accept input from a user, and may be, for example, without limitation, a keyboard, touchscreen, microphone, mouse, etc.

Processor 1410 may process information received over network 1440 from data stream server 1445. Processor 1410 may be coupled to mass storage device 1415 and system memory 1435, where mass storage device 1415 and system memory 1435 may contain program instructions that, when executed by the processor, carry out the steps for updating the SCF used for membership testing of data streams. System memory 1435 and mass storage device 1415 may also contain data associated with the SCF, such as, without limitation, one or more buckets containing one or more slots. System memory 1435 and mass storage device 1415 may be non-transitory computer readable mediums such as, for example, hard drives, solid state drives, volatile random access memory, non-volatile random access memory, flash memory, etc.

Display adapter 1420 and input/output interface 1425 may be configured to display information to the user from system 1400. Information may be formatted according to input/output interface 1425 and may be, for example, streaming data from data stream server 1445 and stored on the SCF.

Network adapter 1430 may communicate over network 1440 with data stream server 1445 to download data from data stream server 1445 and upload data to data stream server 1445. Network adapter 1430 may communicate over network 1440 via wireless means (e.g., Wireless Fidelity (WiFi)), cellular networks, etc.) or via wired means (e.g., ethernet cable).

Performance Analysis

Additional Overhead

Compared with CFs, SCFs need to perform additional update operations to delete stale elements. However, these update strategies may only incur a little overhead to perform slot allocation and eviction strategies. As shown in FIG. 7, all update strategies can optionally or mandatorily omit the reallocation strategy to reduce insertion overhead. Furthermore, only the scanning and skip scanning update strategies need to maintain scanning pointers to record the slot index for update operations. All update strategies only incur additional O(1) computation overhead. Apart from the block design, which leads to O(N) computation complexity overhead for the query operation, all other update strategies incur O(1) computation complexity overhead, which is the same as the standard CF. Note that all additional overhead incurred by update strategies is limited as a constant, efficiently providing stable performance for streaming applications. Furthermore, with the absence of the reallocation strategy after the start of update strategies, the insertion operation overhead of SCF can be limited as a constant, which can guarantee element insertion throughput for streaming applications.

False Positive Rate

As illustrated in (5), the $CF_{FPR}$ is bounded by the total probability of a false fingerprint hit when a query probes the two candidate buckets slots. SCFs, however, always maintain the number of inserted elements as a constant. Note that, the introduced stability property has no effect on the FPR of the SCF. Similar to CF, in the worst case, the $FPR_{SCF}$ is bounded by $2b/2^f$. Specifically, in many cases, the CF cannot be fully occupied and the space occupancy is represented as $\alpha = I$ mb. Thus, on average, the expectation of $FPR_{SCF}$ is formulated as follows:

$$\mathrm{Exp}(FPR_{SCF}) \approx 2b\alpha/2^f \approx 2I/(m \times 2^f) \qquad (6)$$

where I is the number of inserted elements. For different update strategies, I varies according to the threshold $T_\alpha$. Specifically, for the insertion failure update strategy, the space occupancy of SCF will be determined by the space occupancy when the first insertion failure happens. The scanning update strategy and skip scanning update strategy determines the space occupancy of SCF by the configured $T_\alpha$. Thus, for SCFs, the expectation FPR can be further formulated as follows:

$$\mathrm{Exp}(FPR_{SCF}) \approx 2bT_\alpha/2^f \qquad (7).$$

Space Efficiency Vs Insertion Success Probability

For SCFs, the space occupancy efficiency a in the stable state is different according to the adopted update strategy. It is difficult to decide when to perform random update such that a high successful insertion probability can be generated. Therefore, the SCF needs to maintain the $T_\alpha$ at a suitable level. In the following, comprehensive analysis of space occupancy for random update strategy is analyzed to guarantee a high probability of successful insertion, the analysis result is shown in FIG. 7. To make sure that a new element can be inserted into the bucket successfully, either of the two candidate buckets must have an empty slot. The probability that the eviction and insertion operations occur in the same bucket is $$\frac{2m-1}{m^3},$$

which is small and negligible when m is large. As such, SCF must maintain at least one empty slot in each bucket. The space occupancy a of the random update strategy is at around b−1/b, which is also an approximation upper bound for the skip scanning update strategy, block design strategy, and the empty slots design strategy. However, the insertion failure update strategy can guarantee the highest space efficiency because the eviction operation of the insertion failure update strategy is performed in the candidate buckets. To solve the time-sensitive problem, the FIFO strategy multiplexes the index information of elements stored in each bucket. Thus these two strategies can guarantee a relative high space occupancy, i.e., keeping the SCF stable and full at the same time.

The Stable Property

Similar to SBF, the stability property of SCF may be defined according to the FPR of CF as follows:

Theorem 1: The SCF is stable when the expected upper bounded FPR of the SCF remains constant along with the insertion of infinite streaming data.

Proof 1: As shown in (5), the FPR of CF is upper bounded by the number of inserted elements and the number of allocated buckets. As long as the number of inserted elements in SCF is constant, the stability property of the CF can be guaranteed. Note that the SCF can maintain the number of inserted elements as a constant with the continuous insertions of streaming data. Specifically, for each update, the insertion of a new element is coupled with the eviction of a stale one. As shown in (6), with this strategy, the SCFs can guarantee the number of inserted elements in the data structure as a constant and maintain the $FPR_{su}$ stable irrespective of the coming stream data.

Theorem 2: The local time-sensitive update can insert all the coming elements successfully.

Proof 2: Note that, the local time-sensitive update strategy confines the update operation to a local bucket. This strategy not only ensures a time-sensitive update manner by encoding the time information into the local bucket, but also guarantees the empty slot for each insertion via the eviction operation. In conclusion, the SCF can maintain stable performance for insertion workload in terms of the probability of successful insertion and the upper bounded FPR.

TTL of Inserted Elements

The time interval between the insertion and eviction operation of an element x is defined as time to live (TTL) of the element x. Consider that if an element x has been successfully inserted into SCF, after t update steps, the element x is evicted from SCF with the probability $pr(T_i=t_i, T_e=t_e|TTL=t=t_e-t_i)$, where $T_i$ is insertion time, $T_e$ is eviction time and the TTL is the difference of $T_i$ and $T_e$. For the random update strategy, because of the random eviction strategy, each bucket has a probability of 1/mb to be evicted during an update. After t update operations, the probability that the element is exactly evicted is $$\left(\frac{mb-1}{mb}\right)^{t-1}\frac{1}{mb}.$$

For the insertion failure update strategy, because the update operation is performed in the buckets according to the coming elements, after t update operations, the probability that the element is exactly evicted is $$\left(\frac{m-1}{m}\right)^{2(t-1)}\frac{2m-1}{m^2}.$$

For the scanning strategy and the skip scanning update strategy, because of the regular scanning update operations, TTLs both lie in the range of $$\left(\frac{mb(b-2)}{b}, mb\right)$$

without considering the reallocation procedure and the insertion failures. For the block design strategy, the TTL is guaranteed by the range (m'b(N−2), m'bN), because there may be N−2 full sub-CFs between the newest and the oldest sub-CF, where $$m' = \frac{m}{N}$$

is the number of buckets in sub-CF and b is the number of slots in each bucket. In an extreme situation, the TTL is upper bounded by mb(N−1).

For the local time-sensitive update strategy, because the update operation is limited within the candidate buckets of the element, after t update operations, for the empty slots update strategy, the probability that the element is evicted is $$C_q^2\left(\frac{1}{2}\right)^q C_{t-1}^{q-1}\left(\frac{m-1}{m}\right)^{2(t-q)}\left(\frac{2m-1}{m^2}\right)^q, 2 < q \le 2b;$$

for the flag bits update strategy and the FIFO update strategy, the probability is $$C_q^3\left(\frac{1}{2}\right)^q C_{t-1}^{q-1}\left(\frac{m-1}{m}\right)^{2(t-q)}\left(\frac{2m-1}{m^2}\right)^q, 3 < q \le 2b,$$

where q is the number of elements which share the buckets with x.

False Negative Rate

A false negative occurs when a negative answer is given to a query of a member (i.e. an element which has been inserted before). Similar to SBF, SCF allows a number of false negatives to achieve a bounded FPR (stable) using limited storage on unbounded data streams. Different from the FPR which is determined by only filter parameters, the FNR of SCF also depends on the characteristics of input data streams and query workloads. Given an element $x_i$, let $\delta_i$ be the time between the most-recent insertion and query of $x_i$. According to the above discussion, for an inserted element xi, the FNR for element $x_i$ is, $$Pr(FN_i) = \begin{cases} 0, \delta_i \le TTL \\ Pr(\delta_i > TTL), \delta_i > TTL \end{cases} \quad (8)$$

Note that, if $\delta_i \le TTL$, then $Pr(FN_i)$ is always 0 since the element x is still stored in SCF. And if $\delta_i > TTL$, the $Pr(FN_i)$ can be calculated by summing all the probabilities of TTL where $\delta_i$ is larger than TTL.

In summary, as a side effect, false negatives are inevitable for SCF to obtain stability over an unbounded number of insertions. Unlike FPR, determining FNR of SCF relies on the prior knowledge of both insertion element stream as well as query element stream (to calculate the gap value $\delta_i$ for each inserted element $x_i$). As shown in FIG. 8, SCF update strategies are compared in terms of the three design rationales. By absorbing the design philosophy from several less successful SCF designs, as shown, the FIFO update strategy can guarantee all three design rationales.

Experimental Evaluation

SBF, SLBF and FBF are compared with the skip scanning update strategy and local time-sensitive update strategies: the flag bits update strategy, the empty slots update strategy, and the FIFO update strategy. The strategies are compares using state-of-the-art sliding window algorithms when performing membership testing for different datasets with the same memory usage.

Experimental Setup

Datasets:

(1) WIDE traffic trace [28]: a traffic trace collected from Jun 10, 14:00:00, 2020 to Jun 10, 14:15:00, 2020 is referenced and the first 1 M packets are selected. There are 934,874 IPv4 packets and we use src.IP and dst.IP in each packets as the key.

(2) DocWords [29]: Enron emails dataset is referenced, which contains 39,861 documents, 28,102 words in the vocabulary, and 6,400,000 words in the collection. The union of docID and wordID as the key is noted.

(3) Higgs [30]: The Higgs data is a scientific dataset produced using Monte Carlo simulations. There are in total 28 kinematic features and 1,048,576 instances obtained through particle detectors. Features 2 and 3 are used as the key.

(4) Synthetic Dataset: By drawing samples from a zipf distribution from numpy.random.zipf( ) function, a synthetic dataset is generated, which also follows the Zipf distribution. The dataset has 1 M items, and the skewness is 1.2.

Implementation: The codes implemented by C++ for FBF and SLBF come from open sources [31]. SBF and SCFs were implemented in C++. All the experiments were conducted on a laptop with Intel® Core™ i7-9750U CPU @2.60 GHz and 16 GB memory. Each processor has three levels of cache.

Metrics: In experiment, after processing enough items (usually 1-2 window sizes), the experiment result will become stable, which is the same phenomenon as Sliding sketch [13]. The metrics along with the processing of streaming data were measured and test the performance after each N element passing by. The average value was used to represent the experiment result at given parameter setting.

1) Throughput: To test the update overhead, the million insertion operations per second (Mops) is tested. All experiments were repeated 100 times to ensure statistical significance.

2) Number of query error: The metrics focus on the number of incorrectly reported elements including FP and FN. The query sets include all the n items in the present sliding window and n items which are not in the sliding window.

3) Space occupancy: For SCF, space occupancy is evaluated to test space efficiency. SCF is configured to directly record the fingerprint η of each item. With less empty slots, the SCF may be more space efficient.

4) F1 score: With F1 closer to 1, the method performs better. F1 Score may be defined as 2·RE·PR/(RE+PR), where RE is the recall rate and PR is the precision rate.

Parameters setting: For SLBF, the parameters were set according to the original paper [13], k=10 and d=2, where k is the number of hash functions, and d is the number of fields in each bucket. Details of the algorithm can be seen in the original paper. For FBF, the parameters are set according to the recommendation of the authors [23]. For SBF, the parameters are set as the parameters setting optimization of [12]. For each dataset, 650K items were read and the number of the interested recent elements was set as n=50K. For SCF, the length of fingerprint f was set as two bytes, the number of slots in each buckets was set as 4 and the number of buckets w according to the allocated memory, fingerprint length f and the number of slots in each bucket b. Before performing the update strategy, the SCFs work as the same as CF; during the stable phase, whether to use kick-out strategies is determined according to the update strategies, as concluded in FIG. 7. Specifically, for all experiments, the SCFs omit using the kick-out strategy.

Numerical Results

When the memory size is 128 KB (Flag bits with additional 16 KB), f=16, b=4 and the window size n is 50K, the comparison of FIFO update, Empty slots update, skip scanning update and Flag slots update in terms of space occupancy is shown.

1) Space Occupancy:

As shown in FIGS. 9A-9D, the space occupancy of the FIFO update strategy and the flag bits update strategy remain 100%, while the empty slots strategy and skip scanning update strategy were maintained around $$\frac{4-1}{4} \times 100\% = 75\%.$$

The results are consistent with the theoretical analysis, as shown in FIG. 7. Because the skip scanning update strategy and the empty slots strategy must maintain a number of empty slots for incoming elements, a relatively low space occupancy is achieved. Additionally, the space occupancy of the skip scanning update strategy and the empty slots strategy was lower than the FIFO and flag bits update strategies, which can achieve near 100% space occupancy at the stable state. Moreover, the results show that the proposed update strategies are stable in space occupancy after the SCFs get into a stable state.

2) Insertion Throughput:

As illustrated in FIGS. 10A-10D, the memory size is 128 KB (Flag bits with additional 16 KB), f=16, b=4 and the window size n is 50K, and the comparison of FIFO, Empty slots, skip scanning, Flag slots, SBF, SLBF and FBF in terms of throughput is shown.

The SCF update strategies have a relatively low throughput initially while maintaining a high level at the stable state. The reason is that SCFs give up the kick-out reallocation strategy when performing update strategies and maintain a constant time-complexity. Note that the SCF strategies can obtain up to 3×higher throughput than the variants of BF in the worst case. The reason is that the variants of BF need to update multiple cells (bits or counters) to track the data streams, while the local time-sensitive update strategies only need to update at most b slots in one candidate bucket. Specifically, SBF needs to randomly select P counters first and decrease them by 1 if they are non-zero. With the careful setting of P, the fraction of "0" counters in the array tends to be a constant as the insertion number n→∞. However, P tends to be large to achieve a low false positive rate. FBF proposes adjusting its number of past BFs and the refresh frequency to control the false positive rate. However, FBF also has problems with a large number of memory accesses inherited from the structure of multiple active BFs. Moreover, the results show that the insertion speed of SLBF is about 2-3 times faster than FBF, which is consistent with results in [13].

3) Query Accuracy:

As illustrated in FIGS. 11A-11D, the memory size is 128 KB (Flag bits with additional 16 KB), f=16, b=4 and the window size n is 50K, the comparison of FIFO, Empty slots, skip scanning, Flag slots, SBF, SLBF and FBF in terms of the number of false positive error elements is shown.

The FP error was tested against elements in different datasets. Specifically, the elements were recorded in different datasets and the membership of elements was then crosschecked. The results show that the FP error of SLBF increases with stream data processing, and the performance is unstable in different datasets. By contrast, The SCF update strategies and other variants of BF can maintain stability at a very low level. The reason is that the membership testing of SLBF returns the recording of the new window and the old one as query result, while the old window's record is not cleared in time. When querying a non-existent element, a false positive error occurs when the corresponding bits are set by the same elements in the last epochs. Thus, the FP error is introduced by the collided elements and the same uncleared element in the last epoch.

As illustrated in FIGS. 12A-12D, the memory size is 128 KB (Flag bits with additional 16 KB), f=16, b=4 and the window size n is 50K, the comparison of FIFO, Empty slots, skip scanning, Flag slots, SBF, SLBF and FBF in terms of the number of false negative error elements is shown.

The FN error of different methods was tested. SLBF maintains the lowest error, while SBF incurs the highest error. The reason is that SLBF maintains full information in the current windows and the partial elements' information in the last windows. The query result of SLBF is confused by the noise, and the TTL of elements recorded by SLBF range in [n, 2n]. Thus the FN of SLBF was maintained at a low level. While SBF takes a random decrement strategy to evict the old elements, it is unable to delete the elements correctly. The FN error of FBF is unstable for different datasets. Further, FBF cannot maintain an unstable FN error when processing a single data stream. That is because the oldest past BF in FBF is dropped for eviction as a whole. The elements in the oldest past BF will be deleted at once. The membership query proceeds by checking for membership in the future BF until the oldest past BF is reached. If any two consecutive BFs return positive, the FBF terminates the query process and return positive. For data streams with different skewness, this update strategy leads to an unstable performance. The empty slots update strategy incurs a high FN error due to the early eviction of elements for empty slots. While other SCFs can maintain a lower FN error and maintain stable performance in different scenarios. The reason is that SCFs limit the eviction operation at a fine-grained level, i.e., a single slot level. This strategy can guarantee a stable performance for data streams.

As illustrated in FIGS. 13A-13D, the memory size is 128 KB (Flag bits with additional 16 KB), f=16, b=4 and the window size n is 50K, the comparison of FIFO, Empty slots, skip scanning, Flag slots, SBF, SLBF and FBF in terms of the F1 score is shown.

The accuracy is further quantified by calculating the F1 scores of different methods. SBF gets the lowest score. The reason is that the FP error of SBF is the highest among the different methods. Although SLBF and FBF get a higher score in several datasets, they cannot adapt to different scenarios and may incur significant performance vibration when processing streaming data. This phenomenon is because SLBF is unstable to maintain a constant FPR when processing data streams. And FBF incurs unstable FN error because of the drop operation of a whole sub-BF. Note that the empty slots update gets a moderate performance score. The flag bits and FIFO strategies can maintain a high F1 score. The F1 score metrics demonstrate that the local-time sensitive update strategies can perform better and maintain stable performance for data streams.

CONCLUSION

In this paper, the Stable Cuckoo filter is described to solve the approximate membership testing problem on data streams. SCF augments the existing Cuckoo filter with update strategies to enable the most-recent n elements membership testing tasks for streaming data. The experimental and theoretical analysis demonstrate the stable performance of the SCF. Extensive experiments on the real-world and synthetic datasets show that SCFs maintain a stable performance compared with variants of BF and introduce up to 7×less false query errors and yield up to 3×throughput compared with SBF.

The foregoing description of the present disclosure, along with its associated embodiments, has been presented for purposes of illustration only. It is not exhaustive and does not limit the present disclosure to the precise form disclosed. Those skilled in the art will appreciate from the foregoing description that modifications and variations are possible considering the said teachings or may be acquired from practicing the disclosed embodiments.

Likewise, the steps described need not be performed in the same sequence discussed or with the same degree of separation. Various steps may be omitted, repeated, combined, or divided, as necessary to achieve the same or similar objectives or enhancements. Accordingly, the present disclosure is not limited to the said-described embodiments, but instead is defined by the appended claims considering their full scope of equivalents.

REFERENCE LIST

[1] B. Fan, D. G. Andersen, M Kaminsky, and M. Mitzenmacher, "Cuckoo filter: Practically better than bloom," in Proc. of ACM CoNEXT, Sydney, Australia, Dec. 2-5, 2014, pp. 75-88.

[2] B. H. Bloom, "Space/time trade-offs in hash coding with allowable errors," Commun. ACM, vol. 13, no. 7, pp. 422-426, 1970.

[3] A. Breslow and N. Jayasena, "Morton filters: Faster, space-efficient cuckoo filters via biasing, compression, and decoupled logical sparsity," Proc. of VLDB Endow., vol. 11, no. 9, pp. 1041-1055, 2018.

[4] H. Chen, L. Liao, H. Jin, and J. Wu, "The dynamic cuckoo filter," in Proc. of ICNP, Toronto, ON, Canada, Oct. 10-13, 2017, pp. 1-10.

[5] S. Li, L. Luo, D. Guo, and Y. Zhao, "Multiset synchronization with counting cuckoo filters," in Proc. of WASA, Qingdao, China, Sep. 13-15, 2020, Part I, pp. 231-243.

[6] L. Luo, D. Guo, R. T. B. Ma, O. Rottenstreich, and X. Luo, "Optimizing bloom filter: Challenges, solutions, and comparisons," IEEE Commun. Surv. Tutorials, vol. 21, no. 2, pp. 1912-1949, 2019.

[7] L. Luo, D. Guo, O. Rottenstreich, R. T. B. Ma, and X. Luo, "Set reconciliation with cuckoo filters," in Proc. of ACM CIKM, Beijing, China, Nov. 3-7, 2019, pp. 2465-2468.

[8] Y. Sun, Y. Hua, D. Feng, L. Yang, P. Zuo, and S. Cao, "Mincounter: An efficient cuckoo hashing scheme for cloud storage systems," in Proc. Of IEEE MSST, Santa Clara, Calif., USA, May 30-Jun. 5, 2015, pp. 1-7.

[9] M. Wang, M. Zhou, S. Shi, and C. Qian, "Vacuum filters: More space-efficient and faster replacement for bloom and cuckoo filters," vol. 13, no. 2, 2019, pp. 197-210.

[10] A. Shukla and Y. Simmhan, "Toward reliable and rapid elasticity for streaming dataflows on clouds," in Proc. of IEEE ICDCS, Vienna, Austria, Jul. 2-6, 2018, 2018, pp. 1096-1106.

[11] R. Ben-Basat, G. Einziger, R. Friedman, and Y. Kassner, "Heavy hitters in streams and sliding windows," in Proc. of IEEE INFOCOM, San Francisco, Calif., USA, Apr. 10-14, 2016, pp. 1-9.

[12] F. Deng and D. Rafiei, "Approximately detecting duplicates for streaming data using stable bloom filters," in Proc. of ACM SIGMOD, Chicago, Ill., USA, Jun. 27-29, 2006, pp. 25-36.

[13] X. Gou, L. He, Y. Zhang, K. Wang, X. Liu, T. Yang, Y. Wang, and B. Cui, "Sliding sketches: A framework using time zones for data stream processing in sliding windows," in Proc. of KDD, Virtual Event, CA, USA, Aug. 23-27, 2020, pp. 1015-1025.
[14] X. Jin, X. Li, H. Zhang, R. Soule, J. Lee, N. Foster, C. Kim, and I. Stoica, "Netcache: Balancing key-value stores with fast in-network caching," in Proc. of SOSP, Shanghai, China, Oct. 28-31, 2017, pp. 121-136.
[15] F. Lyu, J. Ren, N. Cheng, P. Yang, M. Li, Y. Zhang, and X. Shen, "Demystifying traffic statistics for edge cache deployment in large-scale wifi system," in Proc. of IEEE ICDCS, Dallas, Tex., USA, Jul. 7-10, 2019, pp. 965-975.
[16] Z. Liu, Z. Bai, Z. Liu, X. Li, C. Kim, V. Braverman, X. Jin, and I. Stoica, "Distcache: Provable load balancing for large-scale storage systems with distributed caching," in Proc. of USENIX FAST, Boston, Mass., Feb. 25-28, 2019, pp. 143-157.
[17] Y. Tan, C. Xu, J. Xie, Z. Yan, H. Jiang, W. Srisa-an, X. Chen, and D. Liu, "Improving the performance of deduplication-based storage cache via content-driven cache management methods," IEEE Trans. Parallel Distributed Syst., vol. 32, no. 1, pp. 214-228.
[18] Y. Li, R. Miao, C. Kim, and M. Yu, "Flowradar: A better netflow for data centers," in Proc. of USENIX NSDI, Santa Clara, Calif., USA, Mar. 16-18, 2016, pp. 311-324.
[19] Y. Li, H. Wu, T. Pan, H. Dai, J. Lu, and B. Liu, "CASE: cache-assisted stretchable estimator for high speed perflow measurement," in Proc. Of IEEE INFOCOM, San Francisco, Calif., USA, Apr. 10-14, 2016, pp. 1-9.
[20] Y. Fu, D. Li, S. Shen, Y. Zhang, and K. Chen, "Clustering-preserving network flow sketching," in Proc. of IEEE INFOCOM, Toronto, ON, Canada, Jul. 6-9, 2020, pp. 1309-1318.
[21] S. Narayana, A. Sivaraman, V. Nathan, P. Goyal, V. Arun, M. Alizadeh, V. Jeyakumar, and C Kim, "Language-directed hardware design for network performance monitoring," in Proc. of ACM SIGCOMM, Los Angeles, Calif., USA, Aug. 21-25, 2017, pp. 85-98.
[22] C. Wang, T. Miu, X. Luo, and J. Wang, "Skyshield: A sketch-based defense system against application layer ddos attacks," IEEE Trans. Inf. Forensics Secur., vol. 13, no. 3, pp. 559-573, 2018.
[23] R. Subramanyam, I. Gupta, L. M. Leslie, and W. Wang, "Idempotent distributed counters using a forgetful bloom filter," Clust. Comput., vol. 19, no. 2, pp. 879-892, 2016.
[24] Y. Liu, X. Ge, D. H. Du, and X. Huang, "Par-bf: A parallel partitioned bloom filter for dynamic data sets," Int. J. High Perform. Comput. Appl., vol. 30, no. 3, pp. 259-275, 2016.
[25] J. Wei, H. Jiang, K. Zhou, and D. Feng, "DBA: A dynamic bloom filter array for scalable membership representation of variable large data sets," in Proc. of MASCOTS, Singapore, 25-27 Jul. 2011, pp. 466-468.
[26] D. Guo, J. Wu, H. Chen, and X. Luo, "Theory and network applications of dynamic bloom filters," in Proc. of IEEE INFOCOM, 23-29 Apr. 2006, Barcelona, Catalunya, Spain.
[27] D. Ting and R. Cole, "Conditional cuckoo filters," CoRR, vol. abs/2005.02537, 2020.
[28] MAWI, "Mawi working group traffic archive," http://mawi.wide.ad.jp/mawi/, (Accessed on Dec. 5, 2020).
[29] UCI, "Bag of words data set," https://archive.ics.uci.edu/ml/machine-learning-databases/bag-of-words/, (Accessed on Dec. 5, 2020).
[30] UCI, "Uci machine learning repository: Higgs data set," https://archive.ics.uci.edu/ml/datasets/HIGGS, (Accessed on Dec. 4, 2020).
[31] "Github-sliding-sketch/sliding-sketch," https://github.com/sliding-sketch/Sliding-Sketch, (Accessed on Dec. 6, 2020).

What is claimed is:

1. A method for updating a stable cuckoo filter used for membership testing of data streams, executed by a processor, comprising the steps of:
performing a first hash on a first element to be inserted into the stable cuckoo filter to determine a first candidate bucket;
performing a second hash on a fingerprint of the first element to determine a second candidate bucket, wherein the second hash is performed according to:

$$h_2(x) = h_1 \oplus \text{hash}(\eta_x)$$

where $h_2(x)$ is the second candidate bucket, $h_1$ is the first candidate bucket, $\oplus$ is an exclusive or function, hash( ) is a hash function, and $\eta_x$ is the fingerprint of the first element;
selecting a target candidate bucket from a group consisting of the first candidate bucket and the second candidate bucket;
inserting the first element into the target candidate bucket;
updating the stable cuckoo filter according to a local time-sensitive update strategy; and
obtaining the updated stable cuckoo filter achieving at least one of a space occupancy rationale, a time-sensitive update rationale, and a less update overhead rationale,
wherein the stable cuckoo filter comprises one or more buckets and the one or more buckets comprise one or more slots,
wherein the local time-sensitive update strategy comprises:
encoding time information into the one or more buckets; and
evicting an oldest element from the target candidate bucket according to the time information;
wherein an empty slots update strategy is used for the encoding; and
wherein the empty slots update strategy comprises:
maintaining at least one empty slot in each of the one or more buckets including the target candidate bucket;
inserting the fingerprint of the first element into the at least one empty slot of the target candidate bucket, wherein the at least one empty slot is located at an index j of the target candidate bucket; and
clearing a next slot of the target candidate bucket to create a new empty slot, wherein the next slot is located at an index (j+1)% b of the target candidate bucket, % is a modulus function, b is a number of slots of the target candidate bucket, and the next slot comprises a slot of the target candidate bucket containing a least recently inserted element.

2. A non-transitory computer readable medium containing program instructions for updating a stable cuckoo filter used for membership testing of data streams, wherein execution of the program instructions by one or more processors of a computer system causes the one or more processors to carry out the steps of:
performing a first hash on a first element to be inserted into the stable cuckoo filter to determine a first candidate bucket;

performing a second hash on a fingerprint of the first element to determine a second candidate bucket, wherein the second hash is performed according to:

$$h_2(x) = h_1 \oplus \text{hash}(\eta_x)$$

where $h_2(x)$ is the second candidate bucket, $h_1$ is the first candidate bucket, $\oplus$ is an exclusive or function, hash( ) is a hash function, and $\eta_x$ is the fingerprint of the first element;

selecting a target candidate bucket from a group consisting of the first candidate bucket and the second candidate bucket;

inserting the first element into the target candidate bucket;

updating the stable cuckoo filter according to a local time-sensitive update strategy; and obtaining the updated stable cuckoo filter achieving at least one of a space occupancy rationale, a time-sensitive update rationale, and a less update overhead rationale, wherein the stable cuckoo filter comprises one or more buckets and the one or more buckets comprise one or more slots, and wherein the local time-sensitive update strategy comprises:

encoding time information into the one or more buckets; and evicting an oldest element from the target candidate bucket according to the time information;

wherein a flag bits update strategy is used for the encoding; and wherein the flag bits update strategy comprises:

maintaining one or more flag bits to record an index of a last updated slot of the target candidate bucket;

updating a target slot with the fingerprint of the first element, wherein the target slot is located at an index (flag+1)% b, where flag is the one or more flag bits, % is a modulus function and b is a number of slots of the target candidate bucket; and updating the one or more flag bits with the index (flag+1)% b of the target slot.

* * * * *